(12) United States Patent
Shih et al.

(10) Patent No.: US 12,096,629 B2
(45) Date of Patent: *Sep. 17, 2024

(54) FLOATING GATE TEST STRUCTURE FOR EMBEDDED MEMORY DEVICE

(71) Applicant: Taiwan Semiconductor Manufacturing Company, Ltd., Hsin-Chu (TW)

(72) Inventors: Hung-Ling Shih, Tainan (TW); Yong-Shiuan Tsair, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/344,161

(22) Filed: Jun. 29, 2023

(65) Prior Publication Data

US 2023/0345717 A1    Oct. 26, 2023

Related U.S. Application Data

(63) Continuation of application No. 17/375,077, filed on Jul. 14, 2021, now Pat. No. 11,737,267, which is a (Continued)

(51) Int. Cl.
*H01L 29/423* (2006.01)
*G11C 29/14* (2006.01)
(Continued)

(52) U.S. Cl.
CPC .............. *H10B 41/42* (2023.02); *G11C 29/14* (2013.01); *H01L 21/31116* (2013.01);
(Continued)

(58) Field of Classification Search
CPC ........ H10B 41/42; H10B 41/30; H10B 41/49; H10B 41/10; H10B 41/41; H10B 43/40;
(Continued)

(56) References Cited

U.S. PATENT DOCUMENTS

| 5,864,501 A | 1/1999 | Lee |
| 9,679,662 B1 | 6/2017 | Hashimoto |

(Continued)

FOREIGN PATENT DOCUMENTS

| CN | 109524386 A | 3/2019 |
| KR | 20070109170 A | 11/2007 |
| TW | 201826155 A | 7/2018 |

OTHER PUBLICATIONS

Notice of Allowance dated Mar. 3, 2021 for U.S. Appl. No. 16/720,163.
(Continued)

*Primary Examiner* — Tong-Ho Kim
(74) *Attorney, Agent, or Firm* — Eschweiler & Potashnik, LLC

(57) ABSTRACT

Various embodiments of the present application are directed to a method for forming an integrated circuit (IC) comprising forming a multilayer film to form a plurality of memory cell structures disposed over a substrate and a plurality of memory test structures next to the memory cell structures. A memory test structure comprises a dummy control gate separated from the substrate by a dummy floating gate. The method further comprises forming a conductive floating gate test contact via along sidewalls of the dummy control gate and the dummy floating gate.

20 Claims, 15 Drawing Sheets

Related U.S. Application Data continuation of application No. 16/720,163, filed on Dec. 19, 2019, now Pat. No. 11,069,695.

(60) Provisional application No. 62/855,164, filed on May 31, 2019.

(51) Int. Cl.

| | |
|---|---|
| *H01L 21/28* | (2006.01) |
| *H01L 21/311* | (2006.01) |
| *H01L 21/3213* | (2006.01) |
| *H01L 23/522* | (2006.01) |
| *H01L 23/528* | (2006.01) |
| *H01L 29/08* | (2006.01) |
| *H01L 29/66* | (2006.01) |
| *H01L 29/788* | (2006.01) |
| *H10B 41/30* | (2023.01) |
| *H10B 41/42* | (2023.01) |

(52) U.S. Cl.
CPC .... *H01L 21/32137* (2013.01); *H01L 23/5226* (2013.01); *H01L 23/528* (2013.01); *H01L 29/0847* (2013.01); *H01L 29/40114* (2019.08); *H01L 29/42328* (2013.01); *H01L 29/66825* (2013.01); *H01L 29/788* (2013.01); *H10B 41/30* (2023.02); *H01L 29/66545* (2013.01)

(58) Field of Classification Search
CPC . G11C 29/14; G11C 2029/0403; G11C 29/04; H01L 21/31116; H01L 21/32137; H01L 23/5226; H01L 23/528; H01L 29/0847; H01L 29/40114; H01L 29/42328; H01L 29/66825; H01L 29/788; H01L 29/66545; H01L 22/34; H01L 22/14
USPC .......................................................... 257/48
See application file for complete search history.

(56) References Cited

U.S. PATENT DOCUMENTS

| | | | |
|---|---|---|---|
| 11,069,695 B2* | 7/2021 | Shih | ................... H01L 23/5226 |
| 2007/0026612 A1 | 2/2007 | Lee | |
| 2014/0016404 A1 | 1/2014 | Kim et al. | |
| 2015/0262698 A1 | 9/2015 | Shirakawa | |
| 2016/0181268 A1 | 6/2016 | Chuang et al. | |
| 2016/0260483 A1 | 9/2016 | Shano et al. | |
| 2017/0084531 A1 | 3/2017 | Gu et al. | |
| 2017/0236833 A1 | 8/2017 | Chuang et al. | |
| 2017/0351802 A1 | 12/2017 | Chang et al. | |
| 2018/0151579 A1 | 5/2018 | Liu et al. | |
| 2018/0350831 A1 | 12/2018 | Kim et al. | |
| 2019/0006516 A1 | 1/2019 | Han et al. | |
| 2019/0019567 A1 | 1/2019 | Lien et al. | |
| 2019/0088561 A1* | 3/2019 | Lin | ........................ H01L 22/34 |

OTHER PUBLICATIONS

Non-Final Office Action dated Jan. 18, 2023 for U.S. Appl. No. 17/375,077.

Notice of Allowance dated Apr. 6, 2023 for U.S. Appl. No. 17/375,077.

* cited by examiner

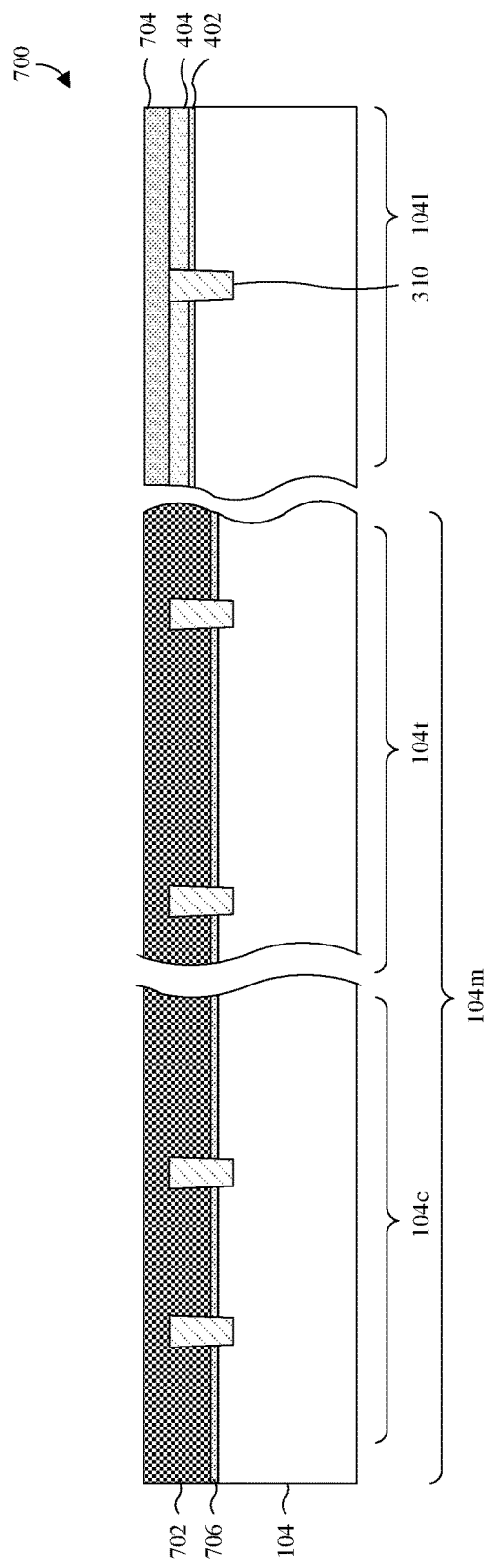
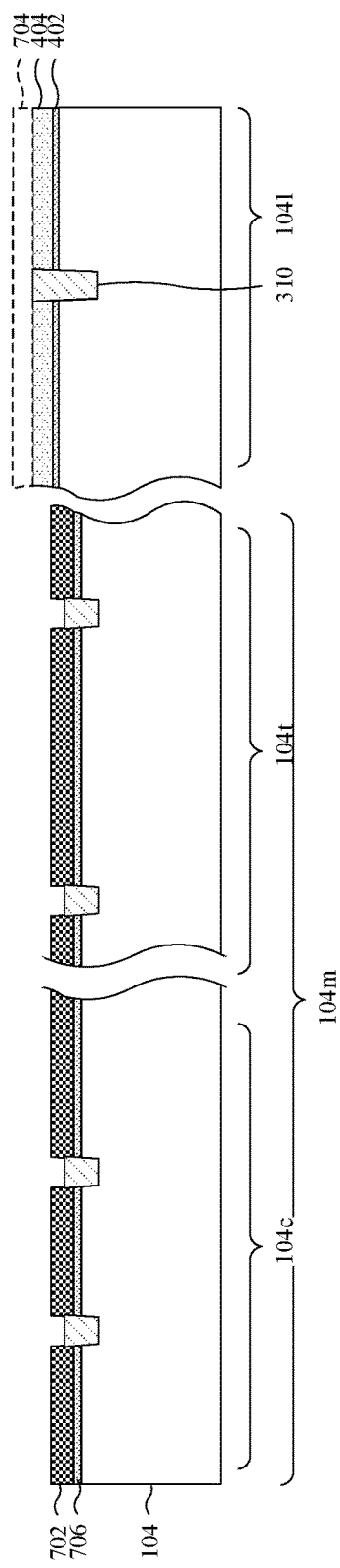
Fig. 7
Fig. 8

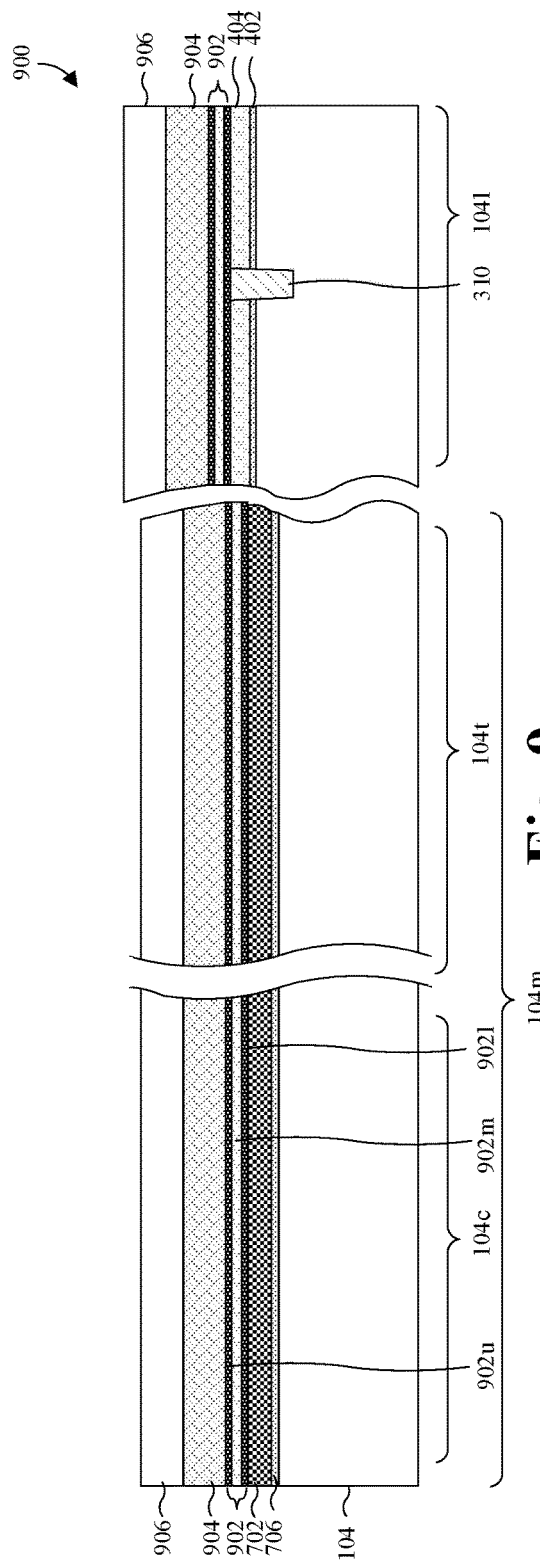
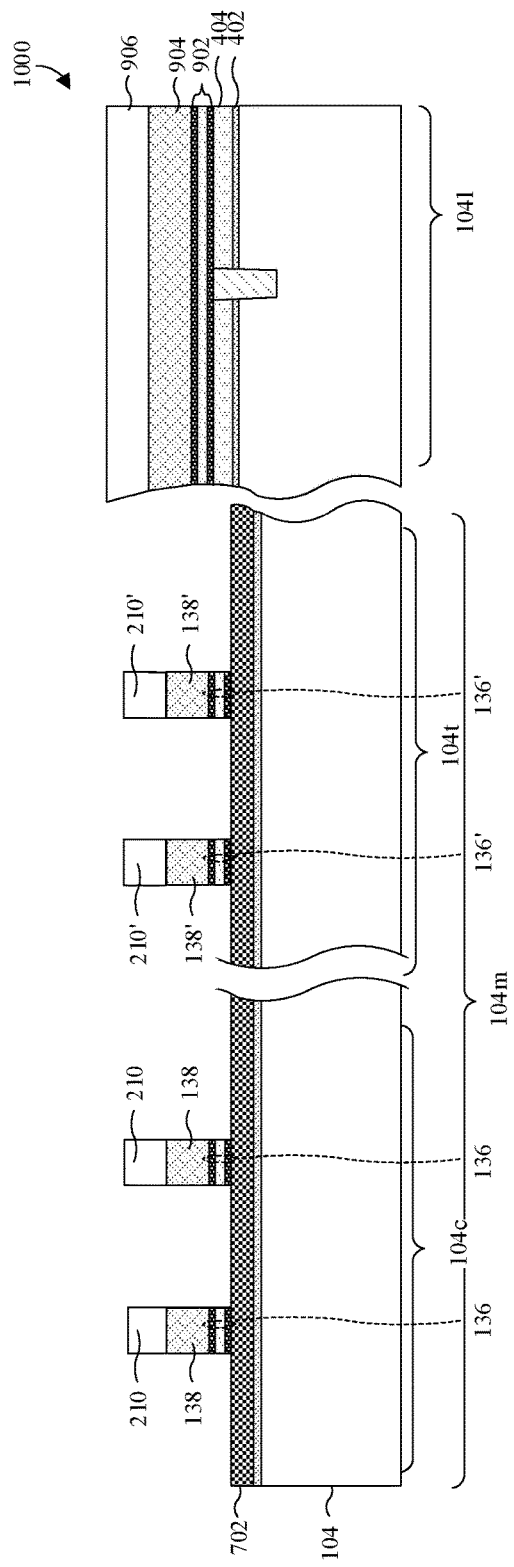
Fig. 9
Fig. 10

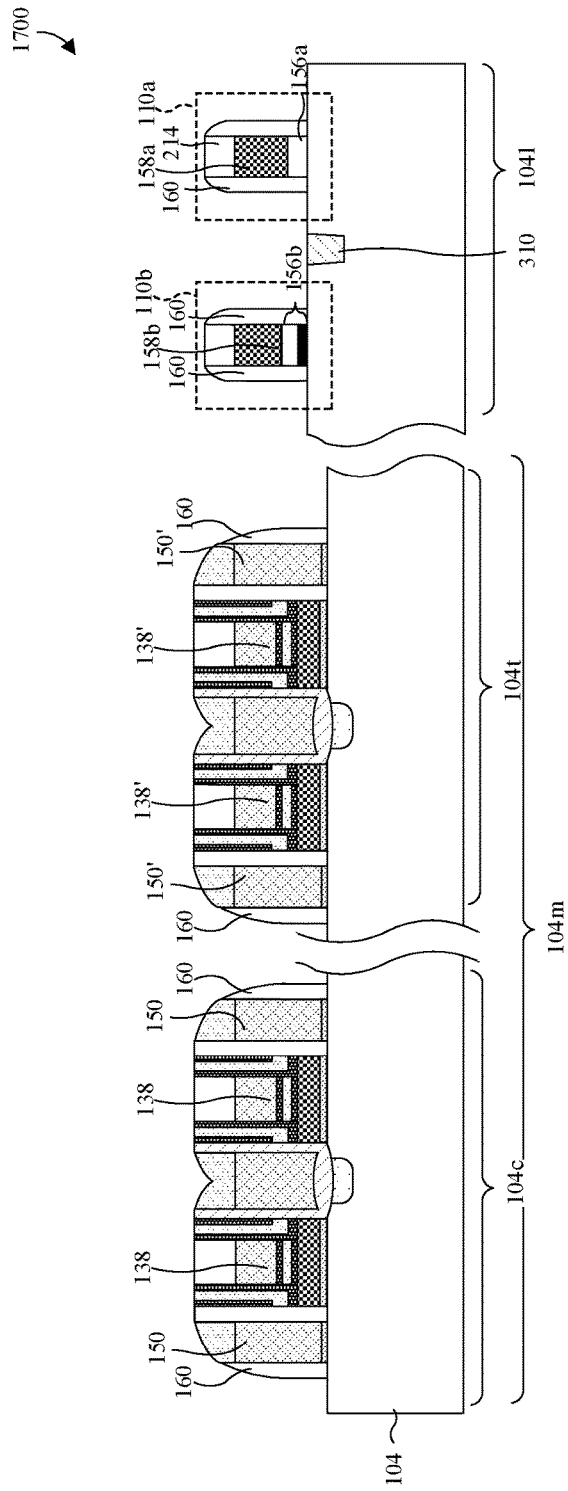
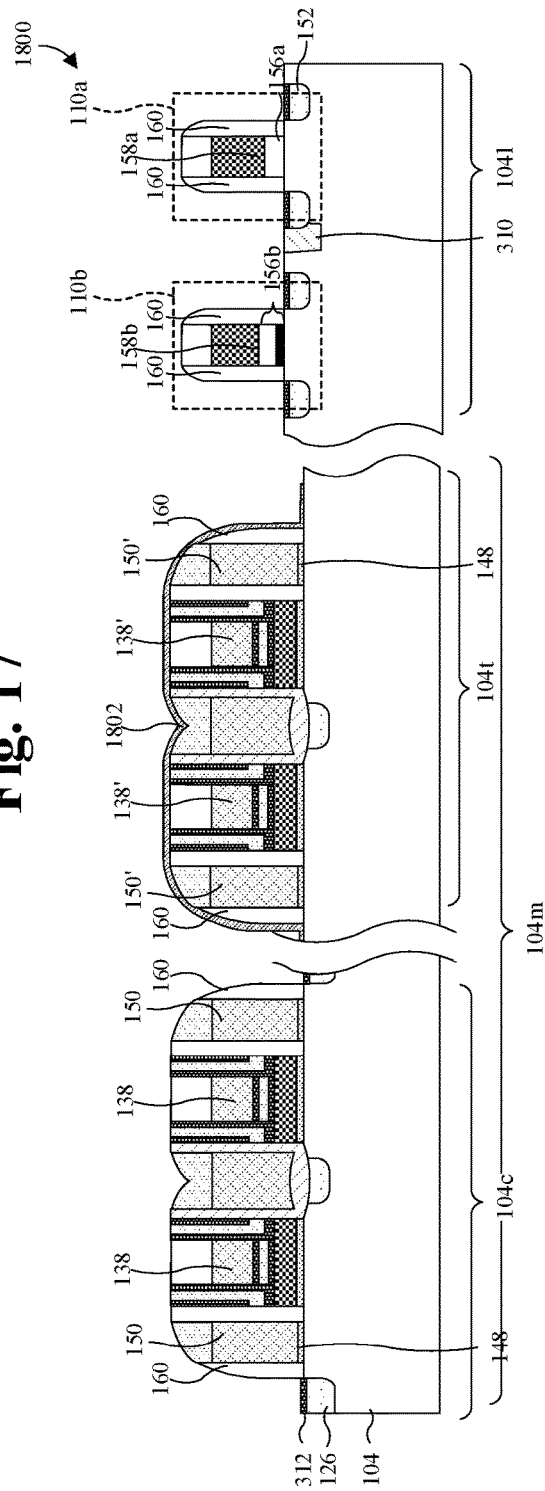
Fig. 17
Fig. 18

FLOATING GATE TEST STRUCTURE FOR EMBEDDED MEMORY DEVICE

REFERENCE TO RELATED APPLICATIONS

This Application is a Continuation of U.S. application Ser. No. 17/375,077, filed on Jul. 14, 2021, which is a Continuation of U.S. application Ser. No. 16/720,163, filed on Dec. 19, 2019 (now U.S. Pat. No. 11,069,695, issued on Jul. 20, 2021), which claims the benefit of U.S. Provisional Application No. 62/855,164, filed on May 31, 2019. The contents of the above-referenced Patent Applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component that can be created) has decreased. Some advancements in the evolution of ICs include embedded memory technology. Embedded memory technology is the integration of memory devices with logic devices on the same semiconductor chip, such that the memory devices support operation of the logic devices. Embedded memory finds application in, among other things, smart cards and automotive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-24 illustrate a series of cross-sectional views of some embodiments of a method for forming an IC comprising an embedded memory boundary structure with a floating gate test structure.

DETAILED DESCRIPTION

Figure 1:
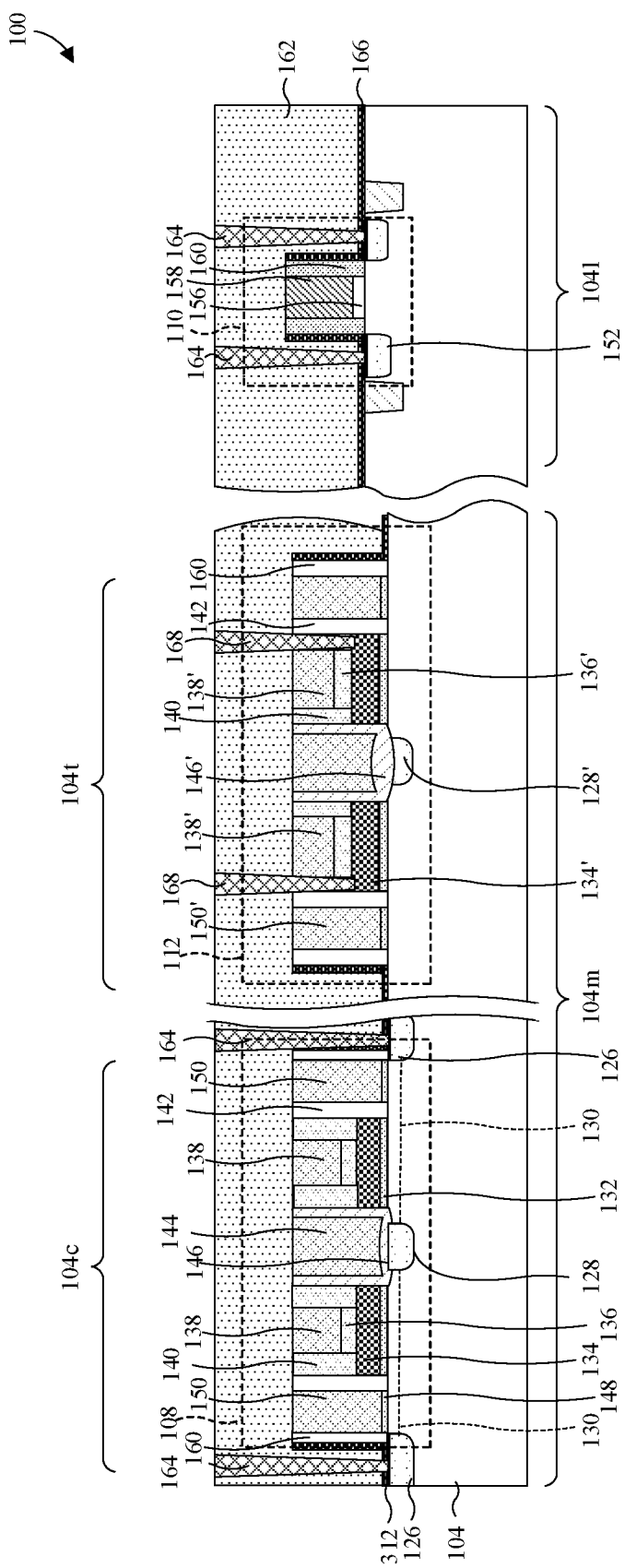
FIG. 1 illustrates a cross-sectional view of some embodiments of an integrated circuit (IC) comprising an embedded memory boundary structure with a floating gate test structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to a method for manufacturing an integrated circuit (IC) with embedded memory technology, a floating gate test structure is formed on a periphery of a memory region of the IC to test the quality of the floating gate during the wafer acceptance test (WAT). One kind of the floating gate test structure is formed and patterned together with the memory cell structure and may comprise a floating gate dielectric layer, a floating gate electrode layer, a control gate layer, and a hard mask layer one stacked above another. The floating gate test structure is subject to an additional patterning process to remove the hard mask layer and the control gate layer and to form an opening exposing the floating gate electrode layer in order to form a floating gate test contact (FGCT). The formation of the FGCT requires an additional photolithography process.

In view of the foregoing, various embodiments of the present application provide a method for forming an IC comprising a memory cell structure and a floating gate test structure without using an additional photolithography process. In some embodiments, the floating gate test structure is formed concurrently with the memory cell structure by forming and patterning a multilayer film on the memory region. The memory cell structure is formed of a pair of floating gates respectively on first and second channel regions of the substrate, a pair of control gates respectively on the floating gates, a pair of hard mask respectively on the control gates, and a pair of select gate electrodes respectively on the first and second channel regions and laterally alongside the control gates. Similar as the structure of the memory cell structure, the memory test structure is formed of at least a dummy floating gate, a dummy control gate over the dummy floating gate, a dummy hard mask over the dummy control gate, and a dummy select gate over a substrate. The dummy floating gate and the dummy control gate are stacked and separated from one another by a dummy control gate dielectric. The dummy select gate is formed on one side of the dummy floating gate and the dummy control gate. In some embodiments, the removal of the dummy hard mask is integrated with the manufacturing processes to etch back and remove hard masks for the logic devices, such that the manufacture is simplified. A conductive floating gate test contact via is then formed through the dummy control gate and reaching on the dummy floating gate for the memory test structure. In some embodiments, the memory test structure may have sizes of each dummy component same, substantially same as the sizes of corresponding component of the memory cell. In some alternative embodiments, the components of the memory test structure may be greater and/or proportional to that of the corresponding components of the memory cell. By removing the dummy hard mask together with the logic gate hard mask and forming the floating gate test contact via through the dummy control gate, no separate photolithography and etching processes are needed for opening the floating gate test structure, and thus the fabrication process is simplified.

FIG. 1 shows a cross-sectional view an IC 100 according to some embodiments. The IC 100 has a substrate 104 including a memory region 104*m* and a logic region 104*l*. A plurality of memory cell structures 108 is disposed on the memory region 104*m* as an array, and a plurality of logic devices 110 is disposed on the logic region 104*l*. At a periphery of the memory region, a plurality of memory test structures 112 is disposed surrounding the plurality of memory cell structures 108. An inter-layer dielectric (ILD) layer 162 is filled between and overlying the memory cell structure 108, the memory test structure 112, and the logic device 110. In some embodiments, the memory test structure 112 comprises similar structures as the memory cell structure 108 and may include a pair of dummy control gates 138' respectively separated from the substrate 104 by a pair of dummy floating gates 134' and a pair of dummy select gate electrodes 150' disposed on opposite sides of the pair of dummy control gates 138'. The memory test structure 112 further comprises a pair of conductive floating gate test contact vias 168 respectively extending through the pair of dummy control gate 138' and reaching on the dummy floating gate 134'.

The memory cell structure 108 comprises a pair of individual memory source/drain regions 126, a common source/drain region 128, and a pair of selectively-conductive memory channels 130. The individual memory source/drain regions 126 and the common source/drain region 128 are in an upper portion of the substrate 104, and the common source/drain region 128 is laterally spaced between the individual memory source/drain regions 126. Further, the individual memory source/drain regions 126 and the common source/drain region 128 are doped semiconductor regions having a first doping type (e.g., p-type or n-type). The selectively-conductive memory channels 130 are doped semiconductor regions having a second doping type (e.g., p-type or n-type) opposite the first doping type.

The memory cell structure 108 may be or otherwise comprise, for example, third generation embedded superflash (ESF3) memory, first generation embedded superflash (ESF1) memory, silicon-oxide-nitride-oxide-silicon (SONOS) memory, metal-oxide-nitride-oxide-silicon (MONOS) memory, or some other suitable type(s) of memory. A pair of floating gate dielectric layers 132, a pair of floating gates 134, a pair of control gate dielectric layers 136, and a pair of control gates 138 are stacked on the selectively-conductive memory channels 130. The floating gate dielectric layers 132 respectively overlie the selectively-conductive memory channels 130 and may be or otherwise comprise, for example, silicon oxide or some other suitable dielectric(s). The floating gates 134 respectively overlie the floating gate dielectric layers 132, the control gate dielectric layers 136 respectively overlie the floating gates 134, and the control gates 138 respectively overlie the control gate dielectric layers 136. The control gates 138 and the floating gates 134 may be or otherwise comprise, for example, doped polysilicon, metal, or some other suitable conductive material(s). The control gate dielectric layers 136 may be or otherwise comprise, for example, silicon nitride, silicon oxide, some other suitable dielectric(s), or any combination of the foregoing. In some embodiments, the control gate dielectric layers 136 each comprise ONO films, such that the control gate dielectric layers 136 each comprise a lower oxide layer, an upper oxide layer, and a middle nitride layer sandwiched between the lower and upper oxide layers.

A pair of control gate spacers 140 overlies each of the floating gates 134. The control gate spacers 140 of each floating gate 134 respectively line opposite sidewalls of each of the corresponding control gates 138. Floating gate spacers 142 are laterally spaced from the common source/drain region 128 by a respective one of the floating gates 134. Further, the floating gate spacers 142 each line a sidewall of the respective one of the floating gates 134. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 are each ONO films, the constituents of which are not shown for ease of illustration.

An erase gate electrode 144 and an erase gate dielectric layer 146 overlie the common source/drain region 128, laterally between the floating gates 134. The erase gate electrode 144 overlies the erase gate dielectric layer 146 and, in some embodiments, has a top surface even with top surfaces respectively of the control gates 138. The erase gate dielectric layer 146 cups an underside of the erase gate electrode 144 to vertically space the erase gate electrode 144 from the common source/drain region 128, and to laterally space the erase gate electrode 144 from the floating gates 134 and the control gate spacers 140. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s).

A pair of select gate dielectric layers 148 and a pair of select gate electrodes 150 are stacked on the selectively-conductive memory channels 130. The select gate dielectric layers 148 respectively overlie the selectively-conductive memory channels 130, each laterally spaced from the common source/drain region 128 by a respective one of the floating gates 134. The select gate dielectric layers 148 may be or otherwise comprise, for example, silicon oxide, silicon nitride, or some other suitable dielectric(s). The select gate electrodes 150 may be or otherwise comprise, for example, doped polysilicon, metal, or some other suitable conductive material(s).

The memory test structure 112 may comprise dummy components corresponding to components of the memory cell structure 108. The dummy components are labeled the same numerals of the corresponding components of the memory cell structure 108 followed by a prime symbol ('). For example, the memory test structure 112 may comprise dummy floating gates 134' similar to the floating gates 134 of the memory cell structure 108, dummy control gates 138' disposed over the dummy floating gates 134' similar to the control gates 138 of the memory cell structure 108, and dummy select gate electrodes 150' disposed along opposite sides of the dummy floating gates 134' and the dummy control gates 138' similar to the selecting gate electrodes 150 of the memory cell structure 108, etc. The dummy components are shown and labeled in figures and are not repeatedly described here for ease of illustration. Different from the memory cell structure 108, in some embodiments, doped regions corresponding to the individual memory source/drain regions 126 and silicide pads corresponding to the silicide pads 312 on the individual memory source/drain regions 126 of the memory cell structure 108 are absent from the memory test structure 112. A pair of floating gate test contact vias 168 is disposed through the dummy control gates 138' reaching on the dummy floating gates 134' and is configured to provide test probing point for the floating gate structure during acceptance test. By having the memory test structure 112 having the similar structure as the memory cell structure 108, manufacturing steps are integrated and simplified, since a separate photolithography and corresponding etching and cleaning processes for the floating gate test structure is no longer needed for the fabrication.

The substrate 104 may comprise, for example, a bulk silicon substrate, a group III-V substrate, a silicon-on-insulator (SOI) substrate, or some other suitable semiconductor substrate(s). The logic device 110 may be or otherwise comprise, for example, an insulated field-effect transistor (IGFET), a metal-oxide-semiconductor field-effect transistor (MOSFET), a double-diffused metal-oxide-semiconductor (DMOS) device, a bipolar complementary metal-oxide-semiconductor (CMOS) DMOS (BCD) device, some other suitable transistor device(s), or some other suitable semiconductor device(s). In some embodiments, the logic device 110 comprises a pair of logic source/drain regions 152 and a selectively-conductive logic channel 154. Further, the logic source/drain regions 152 are doped semiconductor regions having a first doping type (e.g., p-type or n-type). Further, the selectively-conductive logic channel 154 is a doped semiconductor region having a second doping type (e.g., p-type or n-type) opposite the first doping type.

A logic gate dielectric layer 156 overlies the selectively-conductive logic channel 154, and a logic gate electrode 158 overlies the logic gate dielectric layer 156. The logic gate electrode 158 may be or otherwise comprise conductive material, for example, doped polysilicon or some other suitable conductive material(s). The logic gate dielectric layer 156 may be or otherwise comprise, for example, silicon nitride, silicon oxide, a high κ dielectric, some other suitable dielectric(s), or any combination of the foregoing. As used herein, a high κ dielectric is a dielectric with a dielectric constant κ greater than about 3.9. In some embodiments, the logic gate electrode 158 is metal, while the select gate electrodes 150, the erase gate electrode 144, the control gates 138, and the floating gates 134 are doped polysilicon.

In some embodiments, a sidewall spacer 160 lines sidewall surfaces of the logic gate electrode 158, sidewall surfaces of the select gate electrodes 150, and sidewall surfaces of the dummy select gate electrodes 150'. The sidewall spacers 160 may be or otherwise comprise, for example, silicon nitride, silicon oxide, or some other suitable dielectric(s). Further, in some embodiments, a contact etch stop layer (CESL) 166 is disposed along a top surface of the substrate 104, extending upwardly along sidewall surfaces of the pair of select gate electrodes 150 within the memory cell region 104c and along sidewall surfaces of the pair of dummy select gate electrodes 150' within the memory test region 104t, and extending upwardly along a sidewall surface of the sidewall spacer 160 within the logic region 104l. An inter-layer dielectric (ILD) layer 162 is disposed on the contact etch stop layer (CESL) 166, covers the memory cell structures 108 and the logic device 110. The inter-layer dielectric (ILD) layer 162 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9. Further yet, in some embodiments, contact vias 164 extend through the inter-layer dielectric (ILD) layer 162 to the logic source/drain regions 152 and the individual memory source/drain regions 126. The contact vias 164 are conductive and may be or otherwise comprise, for example, tungsten, aluminum copper, copper, aluminum, some other suitable metal(s), or some other suitable conductive material(s).

Figure 2:
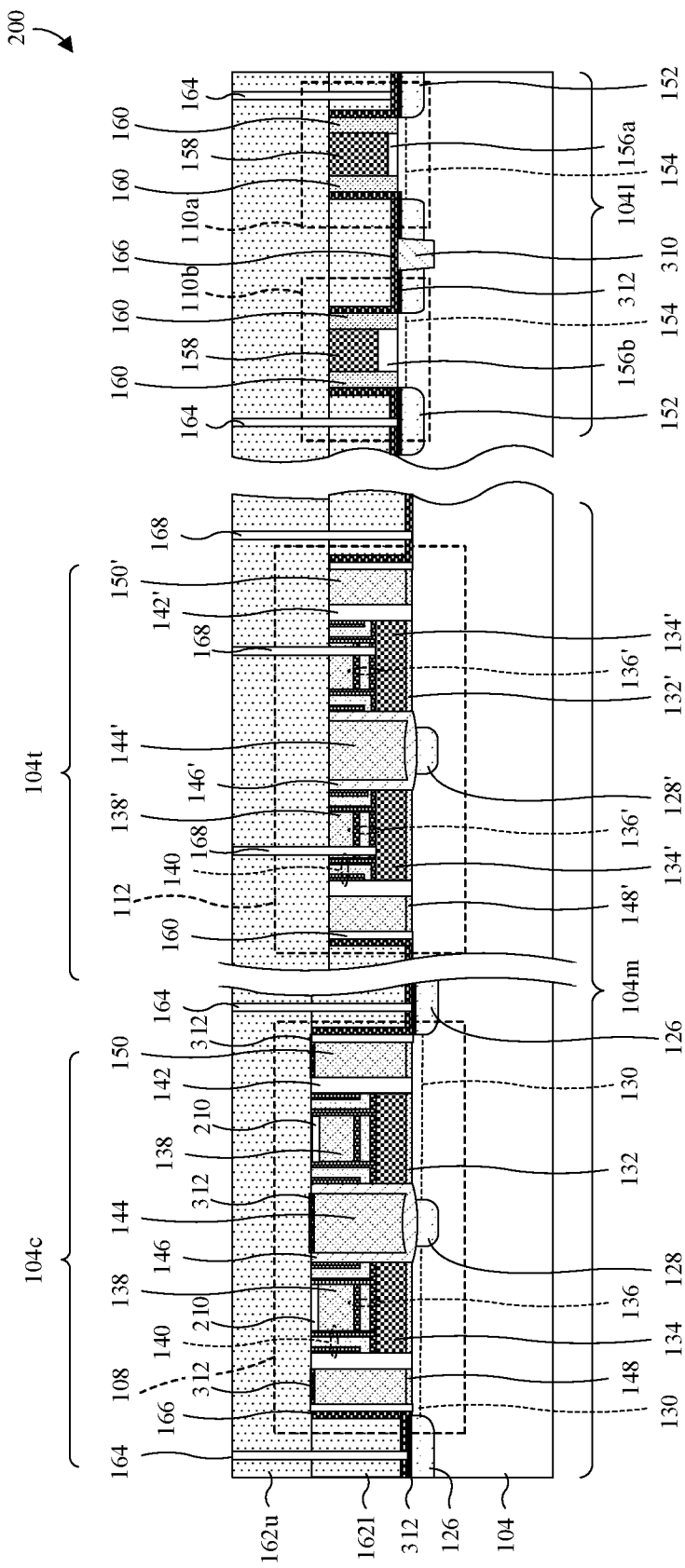
FIG. 2 illustrates a cross-sectional view of some additional embodiments of an integrated circuit (IC) comprising an embedded memory boundary structure with a floating gate test structure.

FIG. 2 shows a cross-sectional view of an integrated circuit (IC) comprising an embedded memory boundary structure with a floating gate test structure according to some additional embodiments. Besides features described associated with FIG. 1, in some embodiments, a pair of control gate hard masks 210 respectively overlies the control gates 138. The control gate hard masks 210 may each be or otherwise comprise, for example, silicon nitride, silicon oxide, some other suitable dielectric(s), or any combination of the foregoing. In some alternative embodiments, some or all of the control gate hard masks 210 may not present in the final device structure. In some embodiments, the control gate dielectric layer 136 comprises a lower oxide layer, an upper oxide layer overlying the lower oxide layer, and a middle nitride layer vertically sandwiched between the lower oxide layer and the upper oxide layer. The control gate spacers 140 may also comprise a middle nitride layer sandwiched between two oxide layers. A floating gate spacer 142 is disposed alongside the control gate spacer 140 and the floating gates 134. The conductive floating gate test contact vias 168 may abut the control gate spacer 140 and the floating gate spacer 142. In some embodiments, silicide pads 312 respectively overlie the logic source/drain regions 152, the individual memory source/drain regions 126, the erase gate electrode 144, the select gate electrodes 150 and/or the logic gate electrode 158. In some embodiments, dummy select gate electrodes 150' and the dummy erase gate 144' are floated and are not coupled to conductive structures such as silicide pads, contacts, or other conductive features. The silicide pads 312 may be or otherwise comprise, for example, be nickel silicide or some other suitable silicide(s).

A first logic device 110a and a second logic device 110b are on the logic region 104l of the substrate 104, physically and electrically separated by an isolation structure 310 laterally between the first and second logic devices 110a, 110b. The isolation structure 310 may be or otherwise comprise, for example, an STI structure, a DTI structure, or some other suitable isolation structure(s). The first and second logic devices 110a, 110b may each be, for example, an IGFET, a MOSFET, a DMOS device, a BCD device, some other suitable transistor device(s), or some other suitable semiconductor device(s). In some embodiments, the first logic device 110a is an IGFET and the second logic device 110b is a power MOFSET configured to operate at higher voltages (e.g., voltages an order of magnitude higher) than the second logic device 110b. The power MOSFET may be or otherwise comprise, for example, a double-diffused metal-oxide-semiconductor (DMOS) device or some other suitable power MOSFET(s). The first and second logic devices 110a, 110b each comprise a pair of logic source/drain regions 152 and a selectively-conductive logic channel 154. The logic source/drain regions 152 of each pair are in a top of the substrate 104 and are laterally spaced. Further, the logic source/drain regions 152 of each pair are doped semiconductor regions having a first doping type (e.g., p-type or n-type). The selectively-conductive logic channels 154 is a doped semiconductor region having a second doping type (e.g., p-type or n-type) opposite the first doping type of the respective pair of logic source/drain regions 152. The first logic device 110a and the second logic device 110b may have different gate dielectric compositions for different operation voltages. As an example for non-limiting example, a first logic gate dielectric layer 156a, a second logic gate dielectric layer 156b, and a logic gate electrode 158 are stacked on the selectively-conductive logic channel 154 of the first logic device 110a, while the first logic gate dielectric layer 156a is absent from the second logic device 110b. The logic gate electrodes 158 may be or otherwise comprise, for example, metal, or some other suitable conductive material(s). The first and second logic gate dielectric layer 156a, 156b may be or otherwise comprise, for example, silicon nitride, silicon oxide, a high κ dielectric, some other suitable dielectric(s), or any combination of the foregoing. In some embodiments, the first logic gate dielectric layers 156a are silicon oxide and high κ dielectric stack, the second logic gate dielectric layers 156b are thicker silicon oxide and high κ dielectric stack, and the logic gate electrodes 158 are metal. In some embodiments, the sidewall spacers 160 comprise a plurality of sidewall spacers respectively lining sidewalls of the logic gate electrodes 158.

A lower ILD layer 162l and an upper ILD layer 162u are stacked on the substrate 104 and accommodate the contact vias 164 and floating gate test contact vias 168. The lower ILD layer 162l is to the sides of the memory cell structure 108, the memory test structure 112, and to the sides of the first and second logic devices 110a, 110b. Further, the lower ILD layer 162l may have an upper surface in the memory test region 104t that is even (e.g., planar or substantially planar) with a top surface of the memory test structure 112 and a top surface of the first logic device 110a and a top surface of the second logic device 110b. The upper ILD layer 162u covers the lower ILD layer 162l, the memory cell structure 108, the memory test structure 112, the first logic device 110a, and the second logic device 110b. The lower and upper ILD layers 162l, 162u may be or otherwise comprise, for example, silicon oxide, silicon nitride, a low κ dielectric, some other suitable dielectric(s), or any combination of the foregoing.

In some embodiments, the floating gate test contact vias 168 extend through the upper ILD layer 162u, the dummy control gate 138', the dummy control dielectric 136' to reach the dummy floating gate 134'. The conductive floating gate test contact via 168 may be disposed at a center region of the dummy control gate 138'. In some alternative embodiments, the conductive floating gate test contact via 168 may be disposed a boundary region of the dummy control gate 138' that abuts or overlaps the control gate spacer 140 and/or the floating gate spacer 142. The control gate spacer 140 and floating gate spacer 142 can be made of one or multiple layers of dielectric materials such as silicon dioxide, silicon nitride, or the combination thereof.

Figure 3:
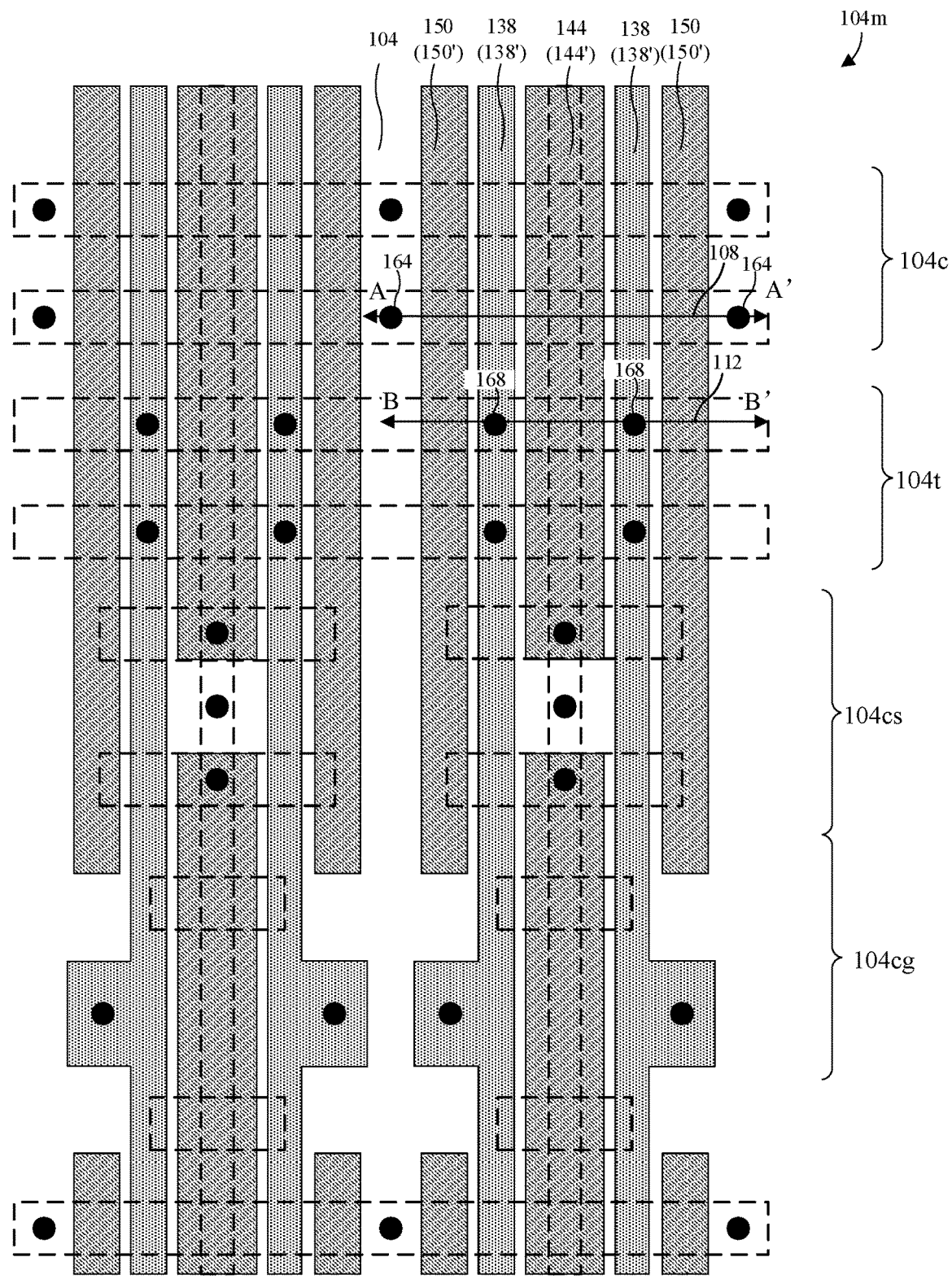
FIG. 3 illustrates a layout view of some embodiments of the IC of FIG. 1 or FIG. 2.

With reference to FIG. 3, a layout view of the memory region 104m of the IC of FIGS. 1 and 2 are provided according to some embodiments. The memory region 104m comprises the memory cell region 104c and the memory test region 104t disposed at a periphery or an ending side of the memory cell region 104c. A plurality of memory cell structures is disposed on the memory cell region 104c. A plurality of memory test structures is disposed at a periphery of the memory region 104m surrounding the plurality of memory cell structures. FIG. 1 or FIG. 2 could be cross-sectional views taken along line A-A' for one of the memory cells 108 and along line B-B' for one of the memory test structures 112. The pair of contact vias 164 is respectively disposed in the substrate 104 on opposite sides of the pair of the select gate electrodes 150. The pair of floating gate test contact vias 168 is respectively disposed through the dummy control gates 138' to reach on the dummy floating gates 134' (see also FIG. 1 or FIG. 2). The floating gate test contact via 168 may have the same or substantially same lateral dimensions with the contact via 164. In some embodiments, a common source strap region 104cs for common source contact is disposed at an outer periphery of the memory test region 104t. In some embodiments, a control gate strap region 104cg for control gate contact is also disposed at an outer periphery of the memory test region 104t. In some alternative embodiments, the common source strap region 104cs and/or the control gate strap region 104cg may be disposed between the memory cell region 104c and the memory test region 104t. Active regions of the substrate 104 are illustrated by dashed line blocks as an example.

Figure 4:
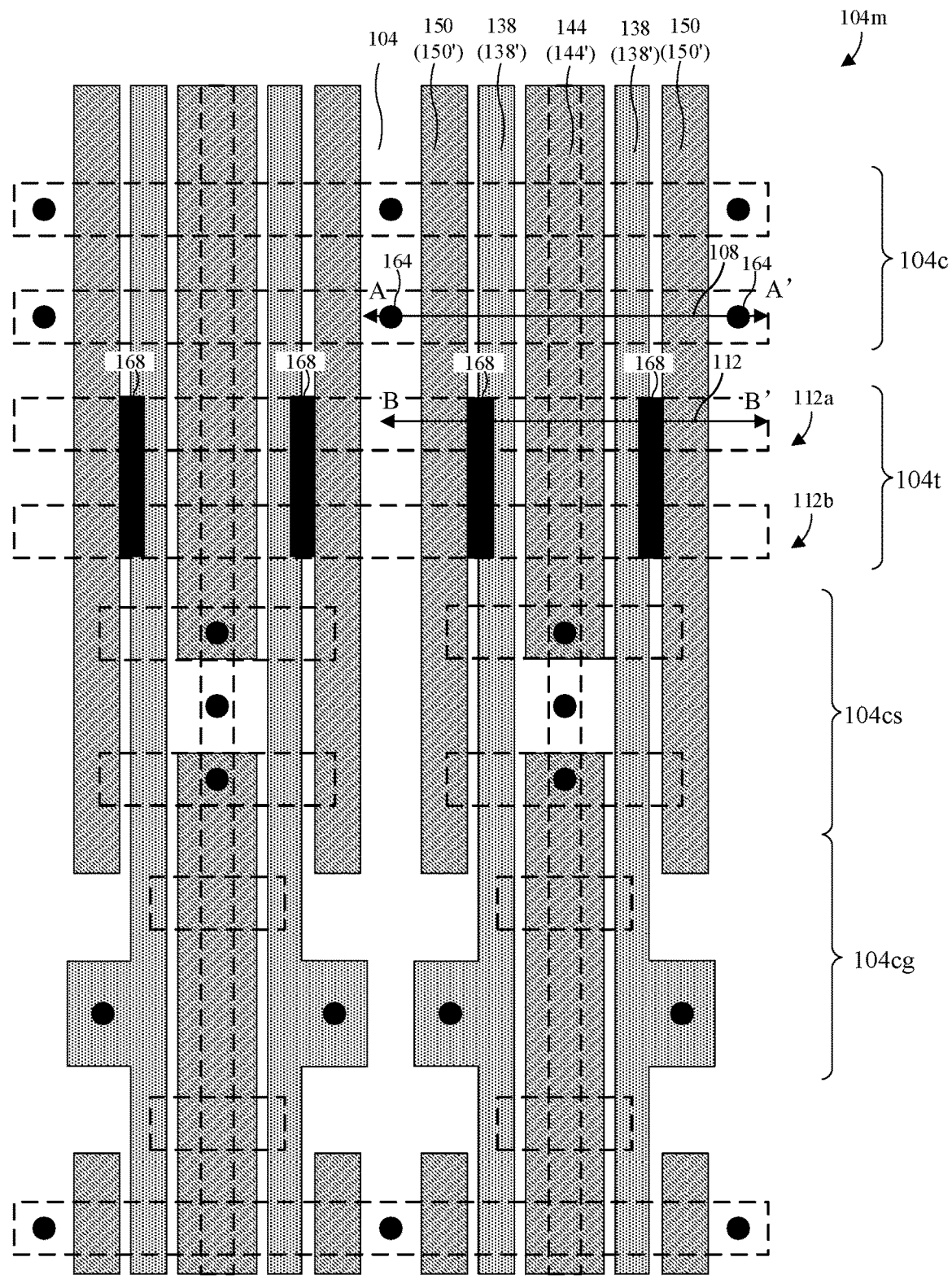
FIG. 4 illustrates a layout view of some alternative embodiments of the IC of FIG. 1 or FIG. 2.

With reference to FIG. 4, a layout view of the memory region 104m of the IC of FIGS. 1 and 2 are provided. According to some embodiments additional to features shown in FIG. 3, the pair of floating gate test contact vias 168 may be disposed in an elongated trench through the dummy control gates 138' and extend across more than one unit of the memory test structure 112 (e.g. across units 112a, 112b) in the memory test region 104t.

With reference to FIGS. 5-24, a series of cross-sectional views 500-2400 illustrates some embodiments of a method for forming an IC comprising an embedded memory with no sidewall spacer within the memory region.

Figure 5:
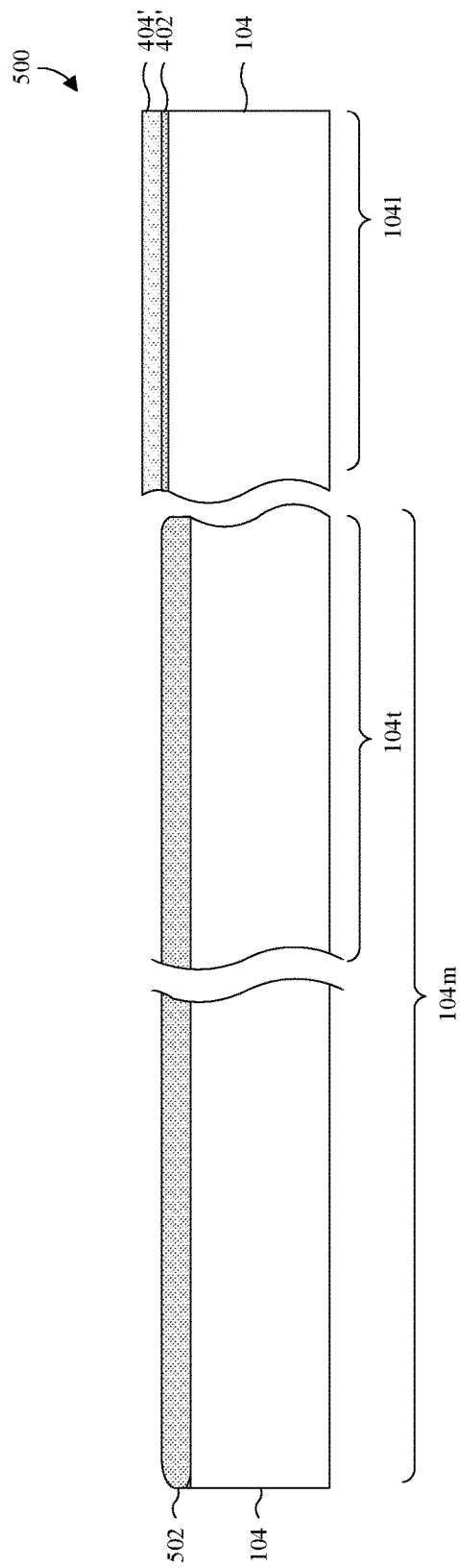

As illustrated by the cross-sectional view 500 of FIG. 5, a substrate 104 is prepared including a memory region 104m and a logic region 104l. In some embodiments, a sacrificial lower pad layer 402' and a sacrificial upper pad layer 404' are formed and patterned over the substrate 104 in the logic region 104l. The sacrificial lower pad layer 402' and the sacrificial upper pad layer 404' are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The sacrificial lower pad layer 402' may, for example, be formed of silicon oxide or some other suitable dielectric(s), and/or the sacrificial upper pad layer 404' may, for example, be formed by silicon nitride or some other suitable dielectric(s). In some embodiments, the substrate 104 is recessed within the memory region 104m by forming a precursor dielectric layer 502 from an upper surface of the substrate 104, and thus reduces a height of the upper surface of the substrate 104 within the memory region 104m. In some embodiments, the precursor dielectric layer 502 is an oxide layer and formed by a thermal oxidation process.

Figure 6:
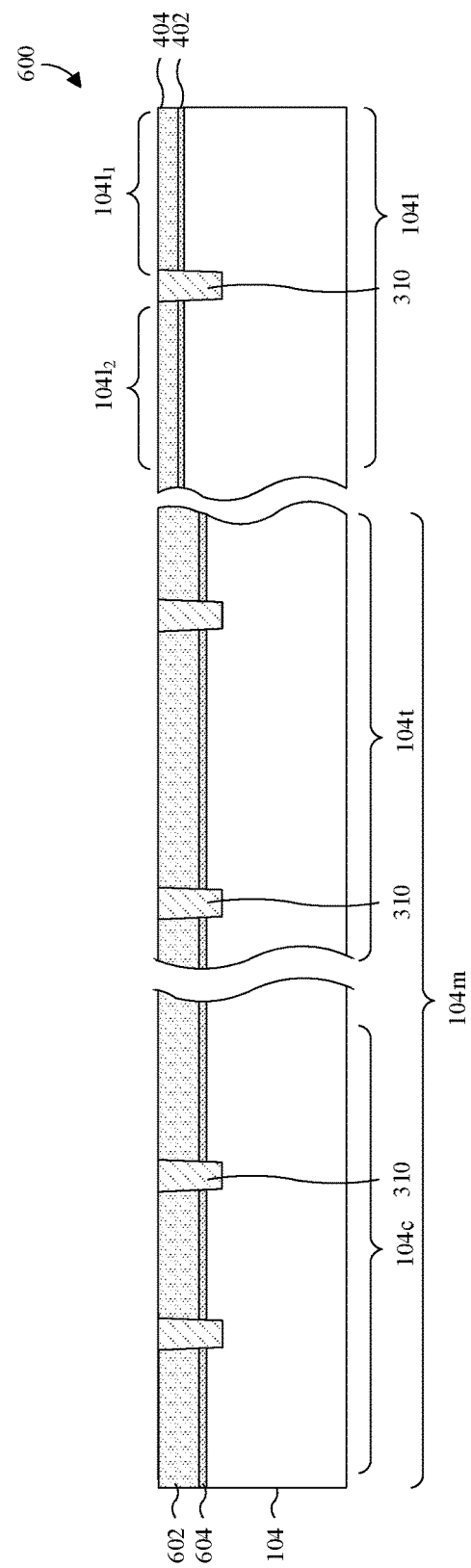

As illustrated by the cross-sectional view 600 of FIG. 6, the precursor dielectric layer 502, the sacrificial upper pad layer 404', and the sacrificial lower pad layer 402' (see FIG. 5) may be removed. A memory dielectric layer 604 and a memory pad layer 602 are formed over the substrate 104 in the memory region 104m. A lower pad layer 402 and an upper pad layer 404 are formed over the substrate 104 in the logic region 104l. The memory pad layer 602 and the lower pad layer 402 may be a dielectric material deposited as one conformal layer. Then the portion of the conformal dielectric material in the memory region 104m is etched and patterned to have a top surface aligned with that of the portion of the conformal dielectric material in the logic region 104*l*. Then, isolation structures are formed through the memory pad layer 602 and/or upper pad layer 404 including an isolation structure 310 within the logic region 104*l*. Besides functioning as a shallow trench isolation for varies memory and logic devices, the isolation structure 310 may also divide the memory region 104*m* into a memory cell region 104*c* and a memory test region 104*t* at the ending edge of the memory cell region 104*c*. The isolation structure 310 may also divide the logic region 104*l* into a first logic region 104*l*$_1$ and a second logic region 104*l*$_2$. The first logic region 104*l*$_1$ may, for example, support core logic devices formed hereafter, whereas the second logic region 104*l*$_2$ may, for example, support high voltage logic devices formed hereafter. The high voltage logic devices may, for example, be logic devices configured to operate at higher voltages (e.g., an order of magnitude higher) than the core logic devices. The isolation structure 310 may, for example, comprise a dielectric material, and/or may be or otherwise comprise, for example, a STI structure, a DTI structure, or some other suitable isolation region(s).

In some embodiments, a process for forming the isolation structure 310 and/or other isolation structures comprises patterning the lower and upper pad layers 402, 404 with layouts of the isolation structure 310 and/or other isolation structures, and an etch is performed into the substrate 104 with the lower and upper pad layers 402, 404 in place to form trenches with the layouts. A dielectric layer is formed filling the trenches, and a planarization is performed to the upper pad layer 404 to form the isolation structures in the trenches. The dielectric layer may, for example, be formed of silicon oxide or some other suitable dielectric material(s), and/or may, for example, be performed by CVD, PVD, sputtering, or some other suitable deposition process(es). The planarization may, for example, be performed by a chemical mechanical polish (CMP) or some other suitable planarization process(es). The patterning may, for example, be performed using photolithography and an etching process.

As illustrated by the cross-sectional views 700-1500 of FIGS. 7-15, a series of manufacturing processes is performed so as a memory cell structure and a memory test structure are formed on the memory region 104*m* from a stack of multilayer memory film, while leaving a remainder of the multilayer memory film on the logic region 104*l*. Some of the manufacturing processes are described below as an example and not for limiting purpose.

As illustrated by the cross-sectional view 700 of FIG. 7, the memory pad layer 602 and the precursor dielectric layer 502 (referred to FIG. 6) are removed, and a memory dielectric layer 706 and a floating gate layer 702 are formed on the memory region 104*m*. In some embodiments, a capping layer 704 is formed and patterned to act as a masking layer for forming and patterning the floating gate layer 702. In some embodiments, the capping layer 704 may comprise one or more dielectric layers. For example, the capping layer 704 may comprise a silicon nitride layer and a silicon oxide layer formed on the silicon nitride layer. The capping layer 704 is formed and patterned to have an opening corresponding to the memory region 104*m*, and to cover the logic region 104*l*. The floating gate layer 702 is firstly formed over the memory dielectric layer 706 covering the memory region 104*m* and formed over the capping layer 704 covering the logic region 104*l*. The floating gate layer 702 may, for example, be formed conformally, and/or may, for example, be formed of doped polysilicon, metal, or some other suitable conductive material(s). In some embodiments, the floating gate layer 702 is formed by CVD, PVD, or some other suitable deposition process(es). Then, a planarization is performed into a top of the floating gate layer 702 until the capping layer 704 is reached, thereby removing the floating gate layer 702 from the capping layer 704. In some embodiments, the planarization recesses a topmost surface of the floating gate layer 702 to about even with a topmost surface of the capping layer 704. The planarization may, for example, be performed by a CMP or some other suitable planarization process(es).

As illustrated by the cross-sectional view 800 of FIG. 8, the floating gate layer 702 is further lowered for a better couple ratio. The floating gate layer 702 may be lowered by a wet etching back process. After lowering the floating gate layer 702, the capping layer 704 may be subsequently removed. For example, at least the silicon oxide layer of the capping layer may be removed during or after lowering the floating gate layer 702.

As illustrated by the cross-sectional view 900 of FIG. 9, a multilayer memory film is formed covering the floating gate layer 702 and the upper pad layer 404. The multilayer memory film comprises a control gate dielectric layer 902, a control gate layer 904, and a control gate hard mask layer 906. In some embodiments, the control gate dielectric layer 902 comprises silicon oxide, silicon nitride, some other suitable dielectric(s), or any combination of the foregoing. For example, the control gate dielectric layer 902 may be an ONO film, and/or may comprise a lower oxide layer 902*l*, a middle nitride layer 902*m* covering the lower oxide layer 902*l*, and an upper oxide layer 902*u* covering the middle nitride layer 902*m*. The control gate dielectric layer 902 may, for example, be formed by CVD, PVD, some other suitable deposition process(es), or any combination of the foregoing. The control gate layer 904 is formed covering the control gate dielectric layer 902. The control gate layer 904 may, for example, be formed conformally, and/or may, for example, be formed of doped polysilicon, metal, or some other suitable conductive material(s). Further, in some embodiments, the control gate layer 904 is formed by CVD, PVD, or some other suitable deposition process(es). The control gate hard mask layer 906 is formed covering the control gate layer 904. In some embodiments, the control gate hard mask layer 906 comprises silicon oxide, silicon nitride, some other suitable dielectric(s), or any combination of the foregoing. For example, the control gate hard mask layer 906 may be a nitride-oxide-nitride (NON) film, and/or may comprise a lower nitride layer 906*l*, a middle oxide layer 906*m* covering the lower nitride layer 906*l*, and an upper nitride layer 906*u* covering the middle oxide layer 906*m*. The control gate hard mask layer 906 may, for example, be formed by CVD, PVD, some other suitable deposition process(es), or any combination of the foregoing.

As illustrated by the cross-sectional view 1000 of FIG. 10, an etch is performed into the multilayer memory film to remove portions of the multilayer memory film from the memory cell region 104*c*, thereby forming a pair of control gate dielectric layers 136, a pair of control gates 138, and a pair of control gate hard masks 210 on the floating gate layer 702. Correspondingly, a pair of dummy control gate dielectric layers 136', a pair of dummy control gates 138', and a pair of dummy control gate hard masks 210' are also formed on the floating gate layer 702 in the memory test region 104*t*. In some embodiments, a process for performing the etch comprises forming and patterning a masking layer (e.g. a photoresist layer not shown in the figure) on the multilayer memory film so as to cover the logic region 104*l*, and so as to partially cover the memory region 104m with a layout of the control gates 138 and dummy control gates 138'. An etchant is then applied to the multilayer memory film with the masking layer in place until the etchant reaches the floating gate layer 702, and the masking layer is thereafter removed.

Figure 11:
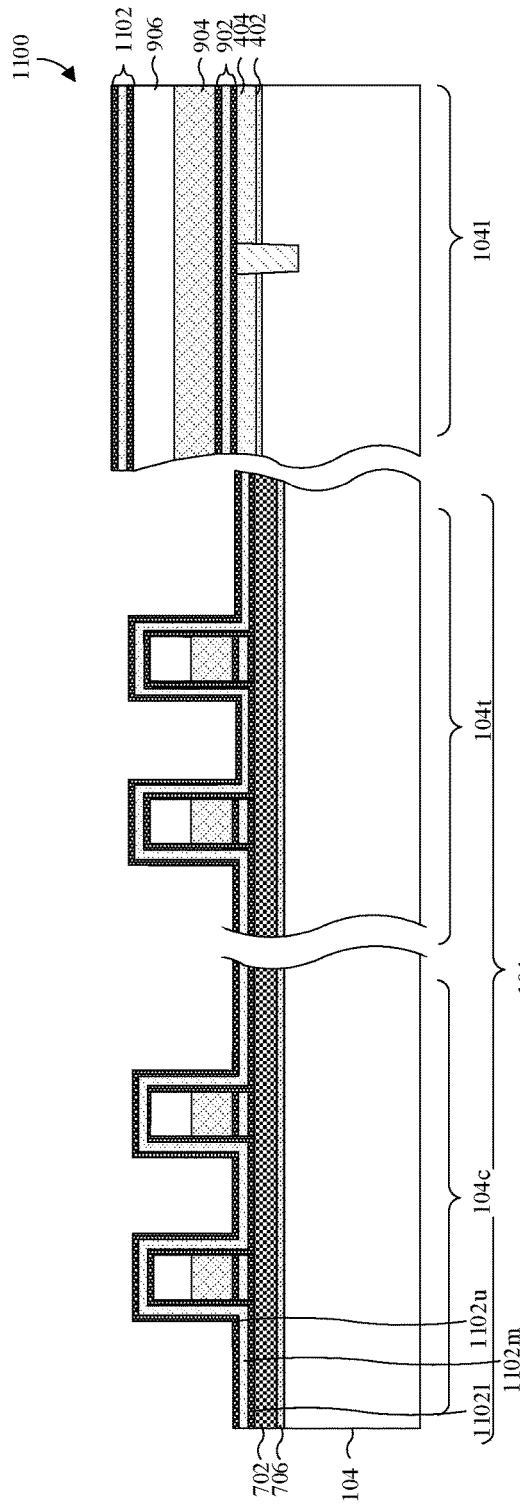

As illustrated by the cross-sectional view 1100 of FIG. 11, a control gate spacer layer 1102 is formed covering and lining the structure of FIG. 10. The control gate spacer layer 1102 may, for example, be formed conformally, and/or may, for example, be formed of silicon oxide, silicon nitride, some other suitable dielectric(s), or any combination of the foregoing. In some embodiments, the control gate spacer layer 1102 is or otherwise comprise an ONO film, and/or comprises a lower oxide layer 1102l, a middle nitride layer 1102m overlying the lower oxide layer 1102l, and an upper oxide layer 1102u overlying the middle nitride layer 1102m. Further, the control gate spacer layer 1102 may, for example, be formed by CVD, PVD, or some other suitable deposition process(es).

Figure 12:
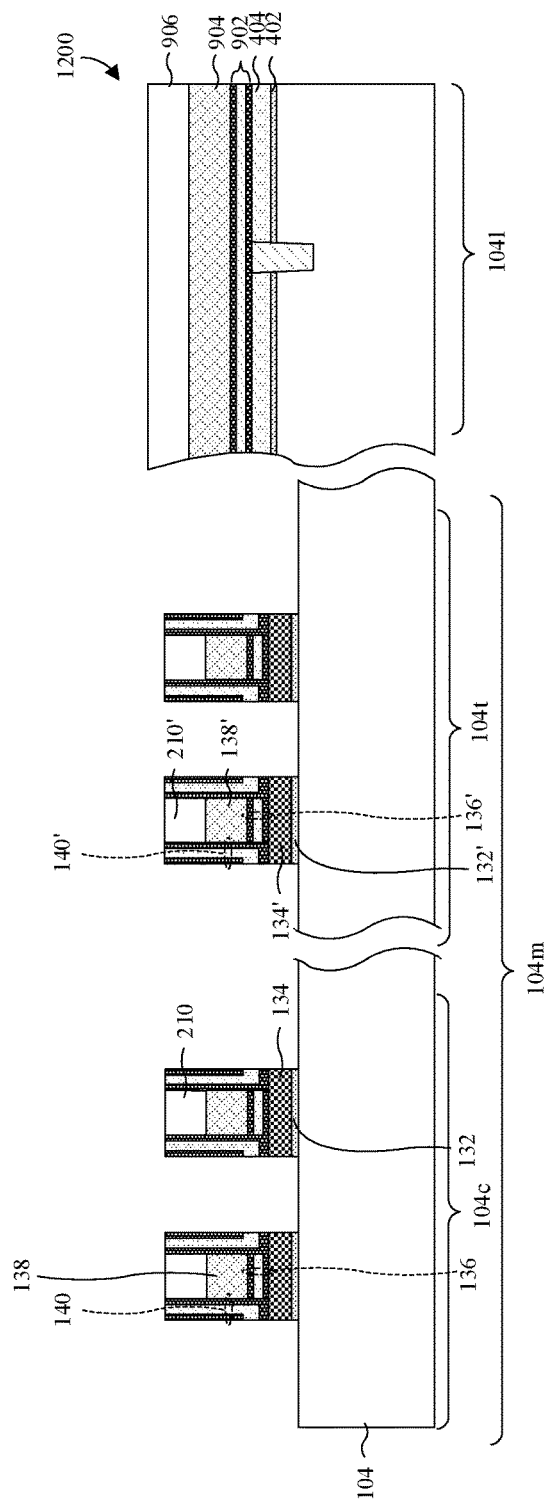

As illustrated by the cross-sectional view 1200 of FIG. 12, a first etch is performed into the control gate spacer layer 1102 (see FIG. 11) to form a control gate spacer 140 along sidewalls of the control gates 138 and the dummy control gates 138'. In some embodiments, a process for performing the etch comprises applying one or more etchants to the control gate spacer layer 1102 until horizontal segments of the control gate spacer layer 1102 are removed. Then, a second etch is performed into the floating gate layer 702 and the memory dielectric layer 706 (see FIG. 11), with the control gate spacers 140 in place and serving as a mask, to form a pair of floating gates 134, a pair of floating gate dielectric layers 132, a pair of dummy floating gates 134', and a pair of dummy floating gate dielectric layers 132'.

Figure 13:
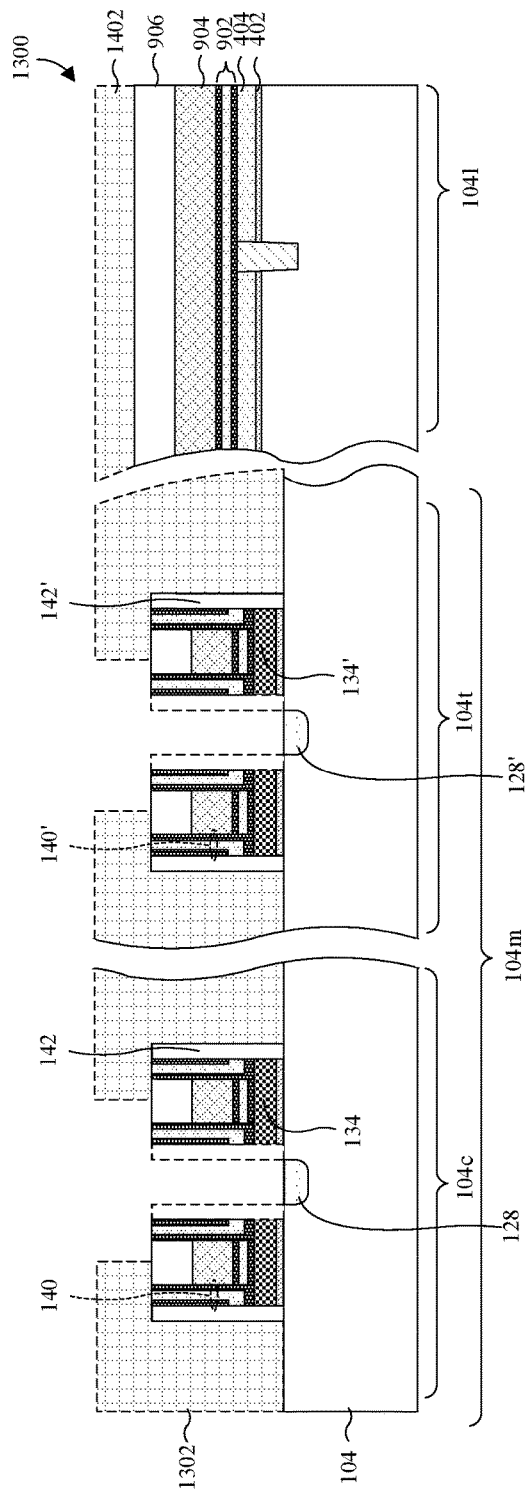

As illustrated by the cross-sectional view 1300 of FIG. 13, a floating gate spacer 142 are formed on sidewalls of the floating gates 134 and the dummy floating gates 134'. In some embodiments, the floating gate spacer 142 comprises silicon oxide, some other suitable oxide(s), or some other suitable dielectric(s). Further, in some embodiments, a process for forming the floating gate spacer 142 comprises depositing a floating gate spacer layer followed by an etch to remove horizontal segments of the floating gate spacer layer without removing vertical segments of the floating gate spacer layer. The floating gate spacer layer may, for example, be deposited conformally, and/or may, for example, be formed by CVD, PVD, or some other suitable deposition process(es).

Then, common source/drain region 128 and the dummy common source/drain region 128' are formed in the substrate 104, laterally between the floating gates 134 and between the dummy floating gates 134', respectively. In some embodiments, a process for forming the common source/drain region 128 and the dummy common source/drain region 128' comprises forming and patterning a masking layer 1302 covering the logic region 104l and the memory region 104m outside common source/drain gaps laterally between the floating gates 134 and between the dummy floating gates 134', respectively. Ion implantation or some other suitable doping process(es) is performed with the masking layer 1302 in place, and the masking layer is thereafter removed.

Figure 14:
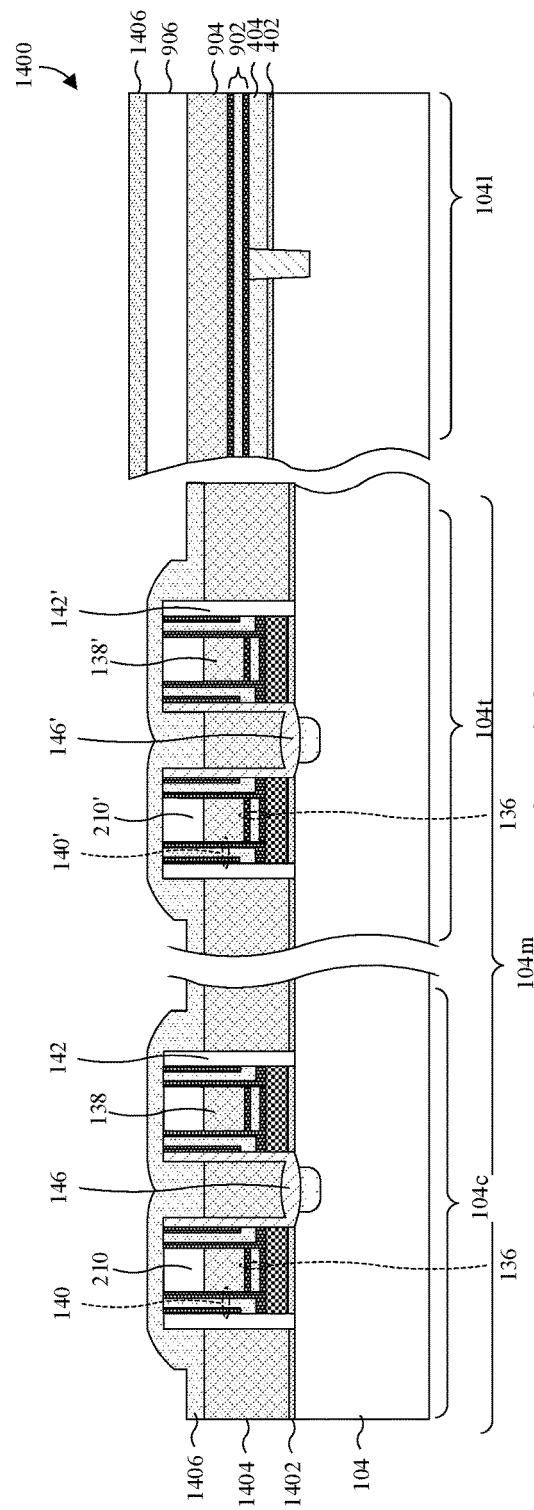

As illustrated by the cross-sectional view 1400 of FIG. 14, an erase gate dielectric layer 146 is formed covering the common source/drain region 128, and further lining sidewalls of the floating gates 134 and sidewalls of the control gate spacers 140 within the common source/drain gap. The erase gate dielectric layer 146 may, for example, be formed of oxide, nitride, or some other suitable dielectric(s). In some embodiments, a process for forming the erase gate dielectric layer 146 comprises high temperature oxidation (HTO), in situ steam generation (ISSG) oxidation, some other suitable deposition or growth process(es), or any combination of the foregoing. Further, in some embodiments, the process comprises removing dielectric material that forms on portions of the memory region 104m outside the common source/drain gap. A dummy erase gate dielectric layer 146 is formed concurrently in the same manner as discussed above.

Then, a memory dielectric layer 1402 is formed covering portions of the memory region 104m on opposite sides of the floating gates 134 and the dummy floating gates 134'. The memory dielectric layer 1402 may, for example, be formed of oxide, nitride, or some other suitable dielectric(s). The memory dielectric layer 1402 may, for example, be formed by HTO, ISSG oxidation, some other suitable deposition or growth process(es), or any combination of the foregoing. A memory gate layer 1404 and a memory hard mask layer 1406 are formed on the memory dielectric layer 1402. The memory gate layer 1404 may, for example, be formed conformally, and/or may, for example, be formed of doped polysilicon, metal, or some other suitable conductive material(s). The memory gate layer 1404 may, for example, be formed by CVD, PVD, or some other suitable deposition process(es).

Figure 15:
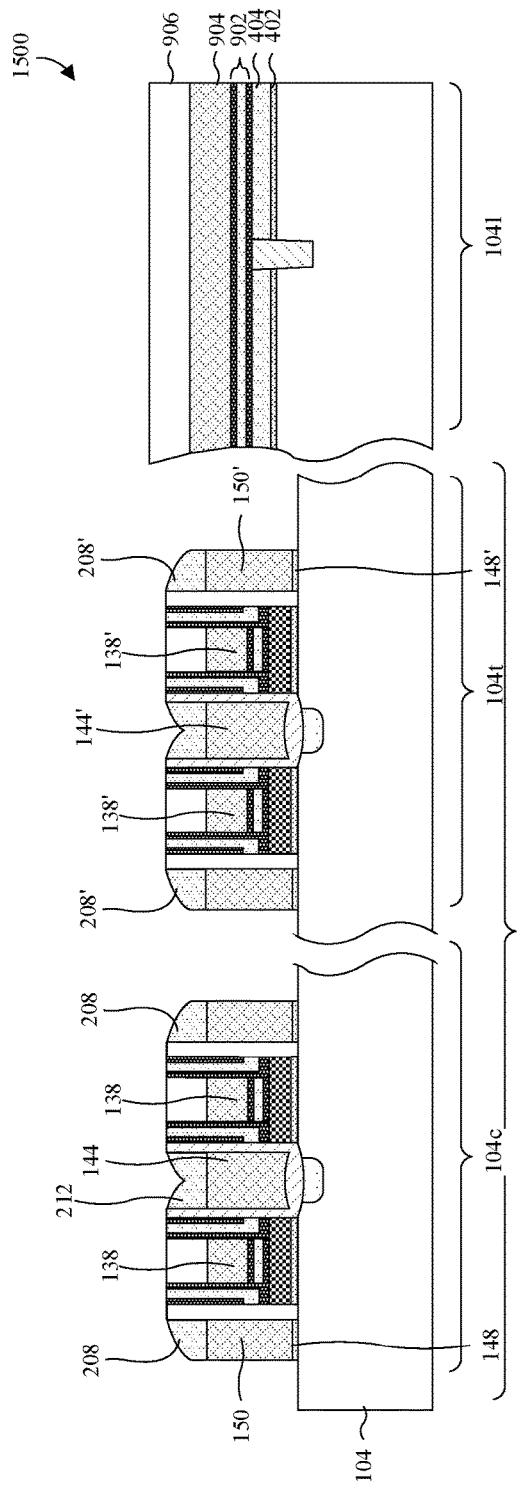

As illustrated by the cross-sectional view 1500 of FIG. 15, the memory hard mask layer 1406 (see FIG. 14) is patterned to form a pair of select gate hard masks 208 on opposite sides of the common source/drain region 128 and an erase gate hard mask 212 overlying the common source/drain region 128. Then, an etch is performed into the memory gate layer 1404 and the memory dielectric layer 1402 (see FIG. 14) with the select gate hard masks 208 and the erase gate hard mask 212 in place to form a pair of select gate electrodes 150, an erase gate electrode 144, and a pair of select gate dielectric layers 148. A pair of dummy select gate electrodes 150', a dummy erase gate electrode 144', and a pair of dummy select gate dielectric layers 148' are formed concurrently in the same manner as discussed above.

Figure 16:
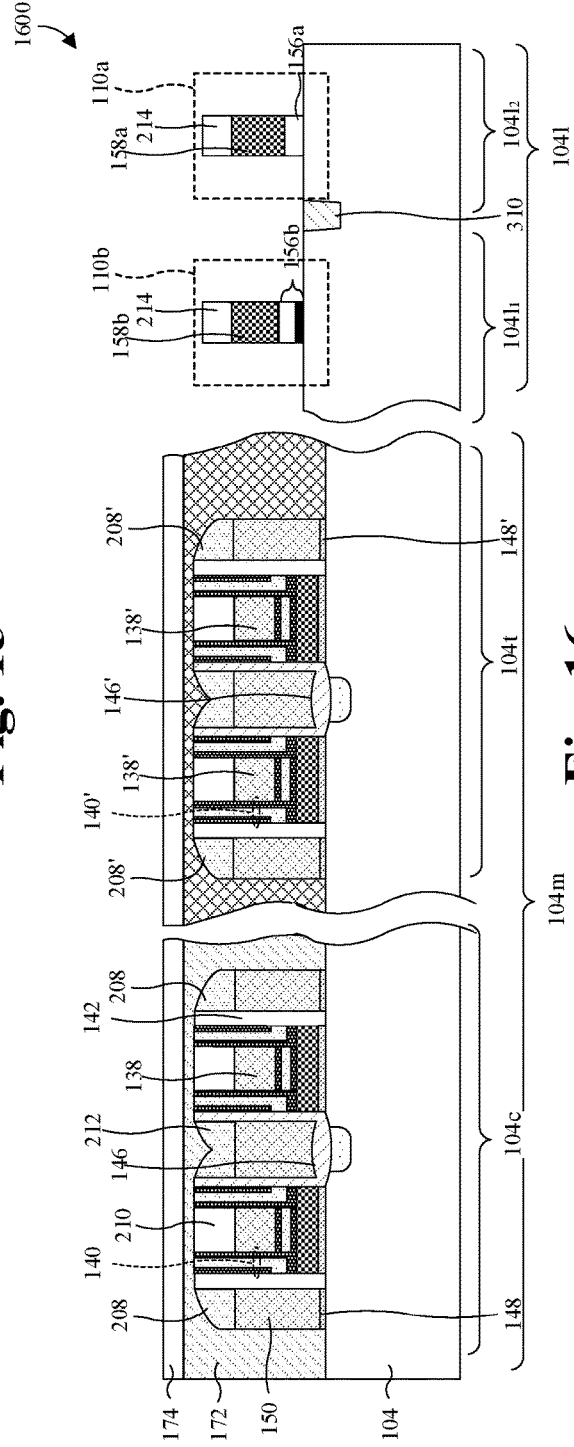

As illustrated by the cross-sectional view 1600 of FIG. 16, a logic device is formed within the logic region 104l. In some embodiments, the memory region 104m may be covered and protected by a protection layer 172 during the formation of the logic device. The protection layer 172 may be made by polysilicon and/or other applicable material for protecting the memory region 104m from damaging when forming the logic device. In some embodiments, a variety of the logic devices are formed within the logic region 104l with varies gate dielectric and gate electrode compositions. As an example, a first logic device 110a is formed in a first logic region 104l$_1$, and a second logic device 110b is formed in a second logic region 104l$_2$. The first logic device 110a and the second logic device 110b may be formed by forming a first logic gate dielectric layer 156a and a second logic gate dielectric layer 156b respectively in the first logic region 104l$_1$ and the second logic region 104l$_2$. The second logic gate dielectric layer 156b can be formed by depositing and patterning a HV dielectric layer in the second logic region 104l$_2$ and absent from the first logic region 104l$_1$. A logic dielectric layer is then formed and patterned on the HV dielectric layer in the second logic region 104l$_2$ to form the first logic gate dielectric layer 156a and directly on the substrate 104 in the first logic region 104l$_1$ to form the second logic gate dielectric layer 156b collectively with the HV dielectric layer. Though not shown in the figure, the logic dielectric layer may comprise one or multiple oxide or other dielectric layers and may be formed and patterned with varies compositions and thicknesses in different logic regions of the substrate 104. Further, a logic gate layer is formed and patterned on the first logic gate dielectric layer 156a to form a first logic gate electrode 158a in the first logic region 104$l_1$, and on the second logic gate dielectric layer 156b to form a second logic gate electrode 158b in the second logic region 104$l_2$. The first logic gate electrode 158a and the second logic gate electrode 158b may be respectively patterned according to a logic gate hard mask 214. The HV dielectric layer may, for example, be formed of oxide, a high κ dielectric (dielectric constant greater than 3.9), some other suitable dielectric(s), or any combination of the foregoing. The HV dielectric layer may be formed conformally, and/or are formed by CVD, PVD, some other suitable growth or deposition process(es), or any combination of the foregoing. The logic dielectric layer may, for example, be formed of oxide, a high κ dielectric, some other suitable dielectric(s), or any combination of the foregoing. The logic gate layer may, for example, be formed of doped or undoped polysilicon, metal, some conductive material, or some other suitable material(s). The logic gate hard mask 214 and a memory hard mask 174 may be formed and patterned from a logic gate masking layer made of one or more dielectric materials such as silicon dioxide or silicon nitride. In some embodiments, the logic gate masking layer, the logic dielectric layer, and the logic gate layer are formed conformally, and/or are formed by CVD, PVD, electroless plating, electroplating, some other suitable growth or deposition process (es), or any combination of the foregoing.

As illustrated by the cross-sectional view 1700 of FIG. 17, a sidewall spacer 160 is formed along sidewalls of the logic gate electrodes 158a, 158b and along sidewalls of the select gate electrodes 150 and the dummy select gate electrodes 150'. In some embodiments, the sidewall spacer 160 may be formed by silicon oxide, silicon nitride, some other suitable dielectric(s), or any combination of the foregoing. Further, in some embodiments, a process for forming the sidewall spacer 160 comprises depositing a spacer layer covering and lining the structure of FIG. 16. An etch back is then performed into the spacer layer to remove horizontal segments of the spacer layer without removing vertical segments of the spacer layer. The spacer layer may, for example, be deposited conformally, and/or may, for example, be formed by CVD, PVD, some other suitable deposition process(es), or any combination of the foregoing.

As illustrated by the cross-sectional view 1800 of FIG. 18, individual memory source/drain regions 126 are formed in the memory cell region 104c, respectively bordering the select gate electrodes 150. Also, logic source/drain regions 152 are formed in pairs within the logic region 104l, with the source/drain regions of each pair respectively bordering opposite sidewalls of the logic gate electrodes 158a, 158b. In some embodiments, a process for forming the individual memory source/drain regions 126 and the logic source/drain regions 152 comprises ion implantation into the substrate 104. In other embodiments, some process other than ion implantation is used to form the individual memory source/drain regions 126 and the logic source/drain regions 152. In some embodiments, individual memory source/drain regions are not formed in the memory test region 104t. A resist protective oxide (RPO) liner 1802 may be deposited to cover the memory test region 104t.

Also illustrated by the cross-sectional view 1800 of FIG. 18, silicide pads 312 are formed on the individual memory source/drain regions 126 and the logic source/drain regions 152. The silicide pads may be absent from the memory test region 104t. The silicide pads 312 may be or otherwise comprise, for example, be nickel silicide or some other suitable silicide(s), and/or may, for example, be formed by a salicide process, or some other suitable growth process (es). The resist protective oxide (RPO) liner 1802 may be deposited conformally first and then selectively removed from the memory cell region 104c and the logic region 104l where silicidation is desired. The RPO liner 1802 may cover and prevent silicidation of the memory test region 104t.

Figure 19:
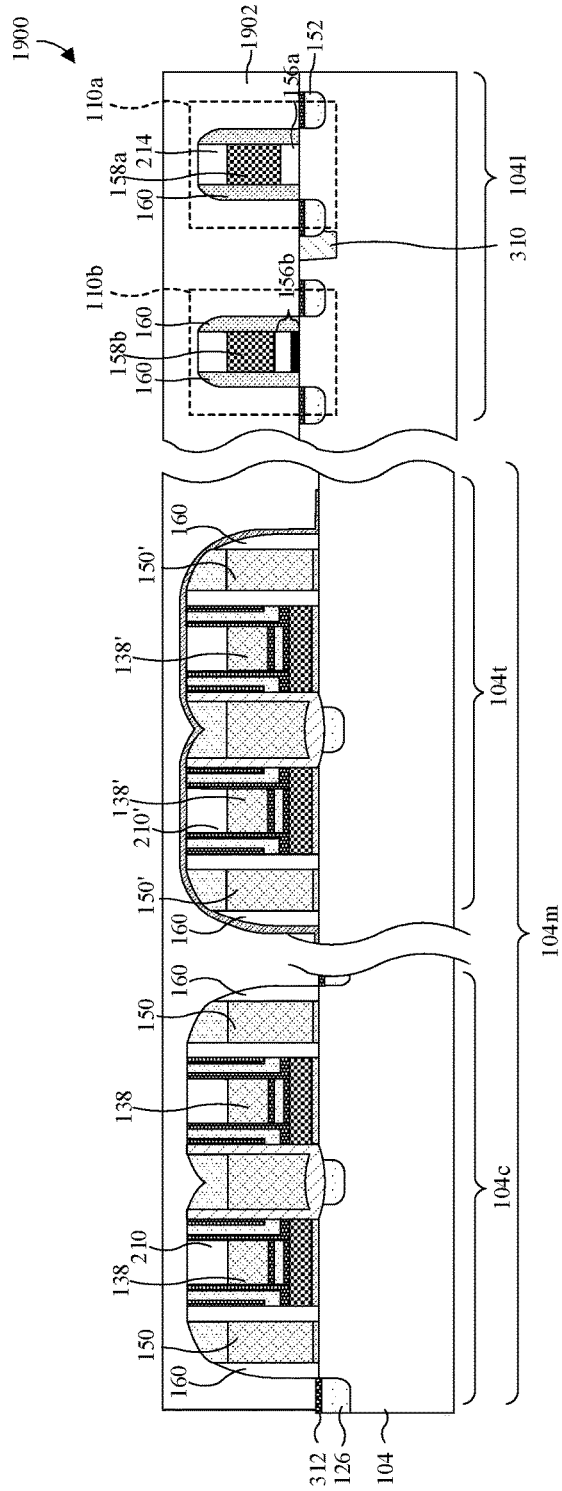

As illustrated by the cross-sectional view 1900 of FIG. 19, in some embodiments, an ARC layer 1902 may then be formed over the substrate 104. The ARC layer 1902 may be formed with a top surface that is planar or substantially planar. A process of forming the ARC layer 1902 may include spinning on an organic ARC coating.

Figure 20:
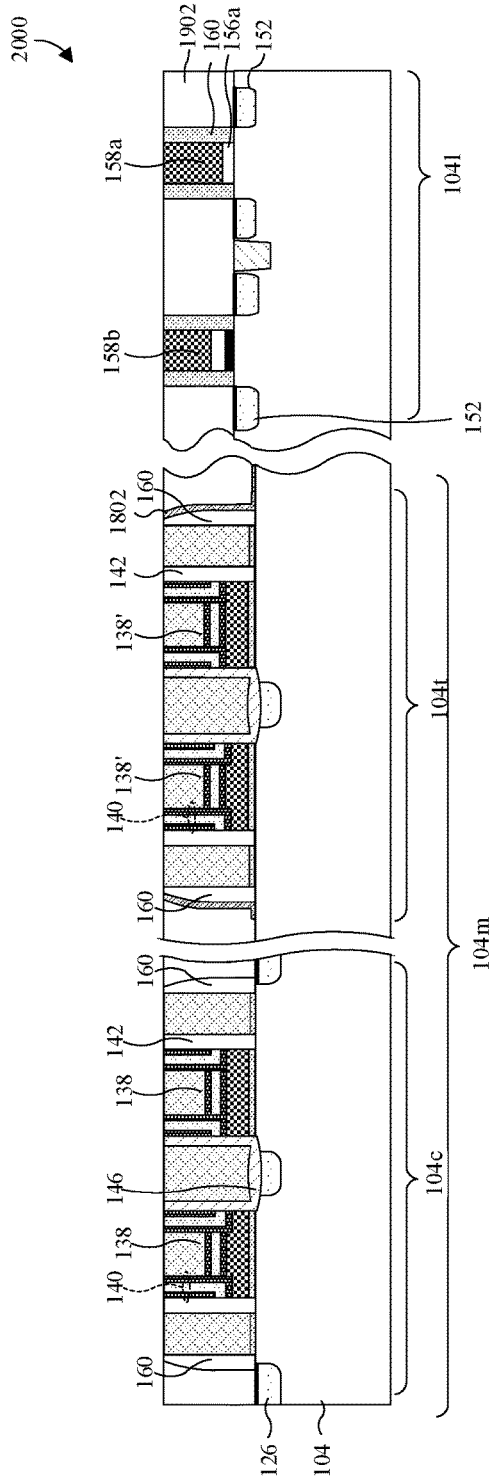

As illustrated by the cross-sectional view 2000 of FIG. 20, in some embodiments, an etching back process is performed to remove an upper layer from the structure illustrated by cross-sectional view 1900 of FIG. 19. The etching back process removes the hard masks and lower varies spacers 140, 142, 160 and the ARC layer 1902. The etching back process may also expose the dummy control gates 138'. By removing the dummy hard mask 210' together with the logic gate hard mask 214, no separate photolithography and etching processes are needed for opening the floating gate test structure, and thus the fabrication process is simplified. In some embodiments, the removal is accomplished with etching using process(es) for which the various materials being removed have similar susceptibilities whereby the upper surface remains substantially planar. A suitable etch process may be a dry etch that includes plasma from fluorocarbon and He etchants. In some alternative embodiments, the removal process may include a CMP process. In some additional embodiments, a photolithography process is performed to cover and protect the memory cell region 104c prior to performing the etching back process.

Figure 21:
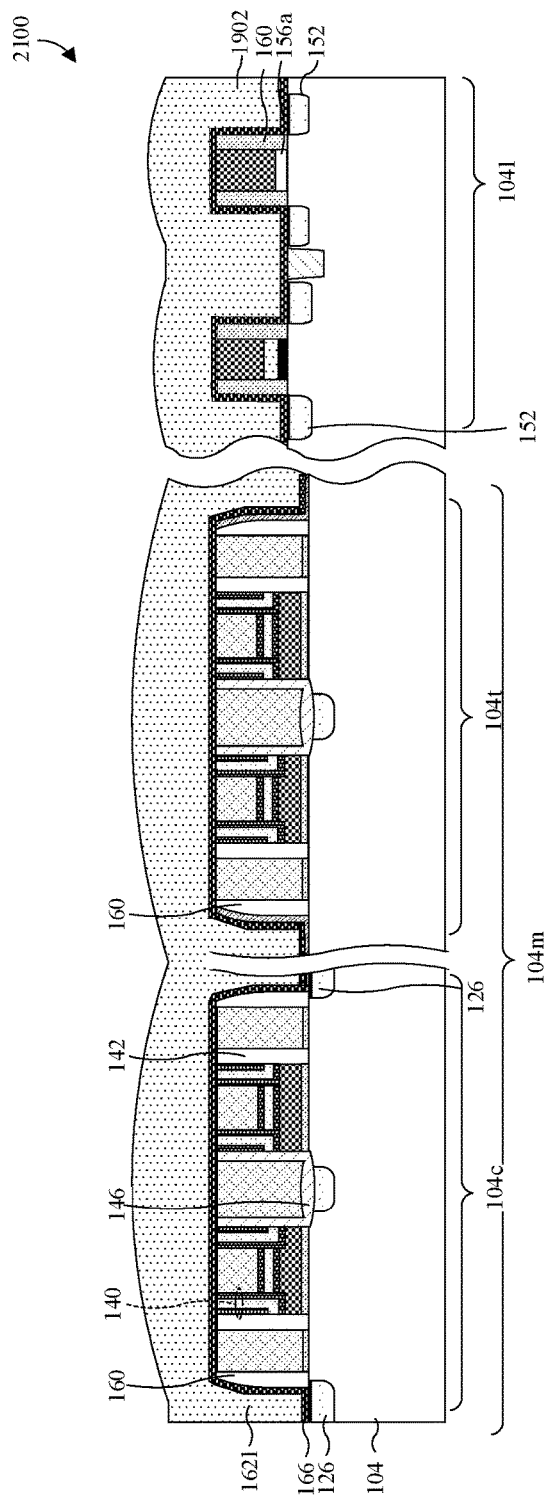

As illustrated by the cross-sectional view 2100 of FIG. 21, in some embodiments, the ARC layer 1902 is removed followed by formation of a contact etch stop layer (CESL) 166 and a lower inter-layer dielectric (ILD) layer 1621 to cover the structure of FIG. 21. The lower ILD layer 1621 may be referred as an ILD0 layer and may comprise, for example, oxide, low κ dielectric, some other suitable dielectric(s), or any combination of the foregoing. The lower ILD layer 1621 may, for example, be deposited by CVD, PVD, sputtering, or any combination of the foregoing.

Figure 22:
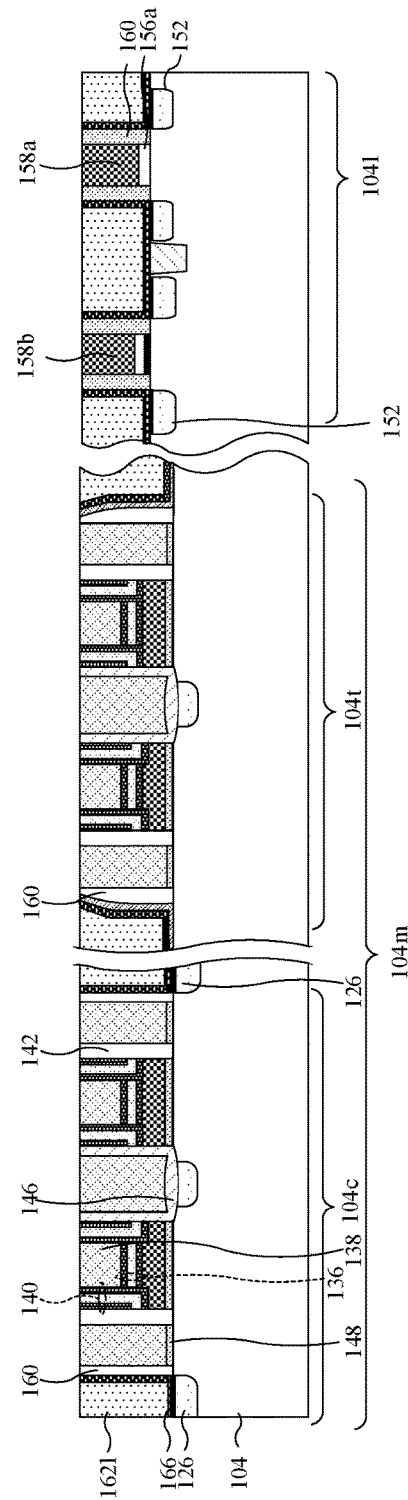

As illustrated by the cross-sectional view 2200 of FIG. 22, a planarization process is performed to the lower inter-layer dielectric (ILD) layer 1621 and the contact etch stop layer (CESL) 166. The planarization process may be, for example, a CMP or some other suitable planarization process(es). The lower ILD layer 1621 is formed with a top surface that is coplanar or substantially coplanar with top surfaces of the remaining structure. The planarization process may be, for example, a CMP or some other suitable planarization process(es). The planarization process may also recess a top surface of the lower ILD layer 1621 to about even with top surfaces of the logic gate electrodes 158a, 158b, thereby exposing the logic gate electrodes 158a, 158b, the erase gate electrode 144 and the select gate electrodes 150. In some embodiments, silicide pads may also be formed on the erase gate electrode 144 and the select gate electrodes 150 similar as shown in FIG. 3 after the planarization process.

Figure 23:
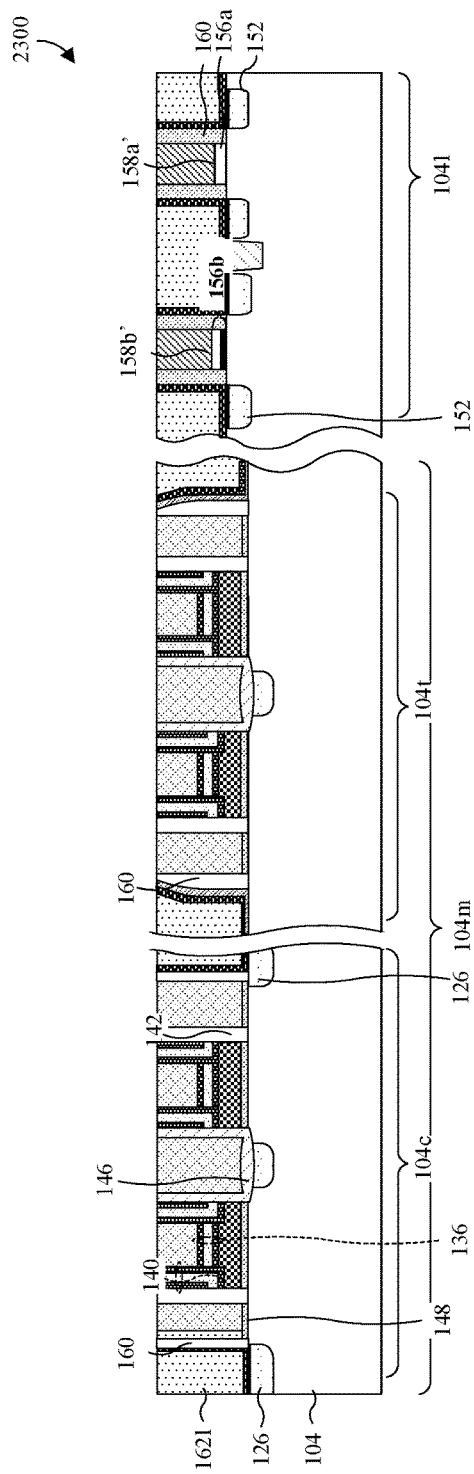

As illustrated by the cross-sectional view 2300 of FIG. 23, a replacement gate process is then performed: an etch is performed into the logic gate electrodes 158a, 158b to remove the logic gate electrodes 158a, 158b. In some embodiments, the etch is performed with a masking layer in place to protect other regions of the structure until the logic gate electrodes 158a, 158b are removed. Metal gate electrodes 158a', 158b' are then formed in place of the logic gate electrodes 158a, 158b. The metal gate electrodes 158a', 158b' may, for example, be metal, a different material than the logic gate electrodes 158a, 158b, or some other suitable conductive material(s). In some embodiments, a process for forming the metal gate electrodes 158a', 158b' comprises forming a conductive layer by, for example, by CVD, PVD, electroless plating, electroplating, or some other suitable growth or deposition process(es). A planarization is then performed into the conductive layer until the lower ILD layer 162l is reached. The planarization may, for example, be performed by a CMP or some other suitable planarization process(es).

Figure 24:
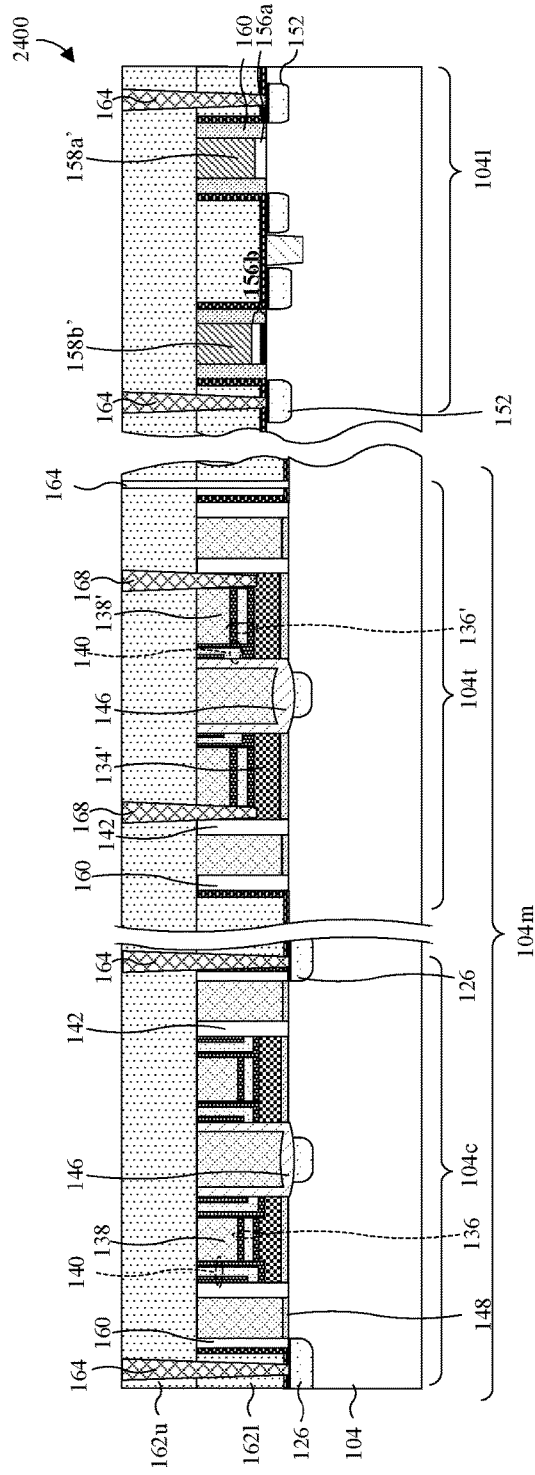
Figure 25:
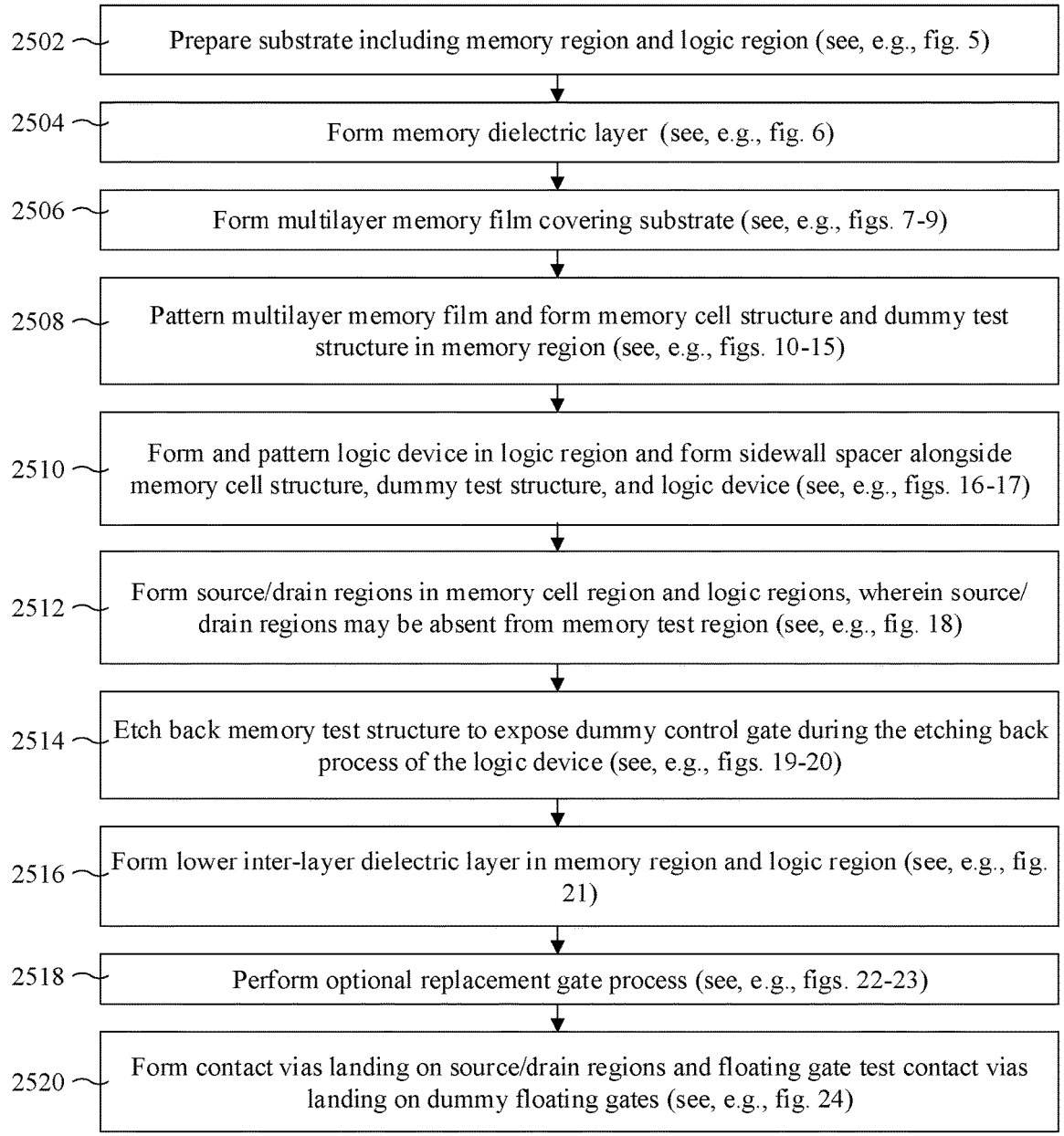
FIG. 25 illustrates a flowchart of some embodiments of the method of FIGS. 5-24.

As illustrated by the cross-sectional view 2400 of FIG. 24, an upper ILD layer 162u is formed covering the structure of FIG. 25 and with a top surface that is planar or substantially planar. The upper ILD layer 162u may, for example, be oxide, a low κ dielectric, some other suitable dielectric(s), or any combination of the foregoing. Further, the upper ILD layer 162u may, for example, be formed depositing the upper ILD layer 162u, and subsequently performing a planarization into the top surface of the upper ILD layer 162u. The deposition may, for example, be performed by CVD, PVD, sputtering, or any combination of the foregoing. The planarization may, for example, be performed by a CMP or some other suitable planarization process(es).

Also illustrated by the cross-sectional view 2400 of FIG. 24, contact vias 164 are formed extending through the upper ILD layer 162u and the lower ILD layer 162l to the individual memory source/drain regions 126, the logic source/drain regions 152, the common source/drain region 128, the control gates 138, the select gate electrodes 150, the erase gate electrode 144, the logic gate electrodes 158a, 158b, or any combination of the foregoing. Floating gate test contact vias 168 are formed extending through the upper ILD layer 162u, the dummy control gate 138', the dummy control dielectric 136' to reach the dummy floating gate 134'. Openings for the conductive floating gate test contact vias 168 are formed by a series etching processes. The etching processes includes etching steps with dielectric over etching and a final linear remove step with strong etching selectivity of dielectric (e.g. silicon dioxide) material to polysilicon material. In some embodiments, the openings for the conductive floating gate test contact vias 168 are formed to reach a boundary region of the dummy floating gate 134' that abuts the control gate spacer 140 and/or the floating gate spacer 142. The control gate spacer 140 and floating gate spacer 142 can be made of one or multiple layers of dielectric materials such as silicon dioxide, silicon nitride, or the combination thereof. The etchant used for the patterning of the opening is more selective to the materials of the control gate spacer and the floating gate spacer. As a result, the formed conductive floating gate test contact via 168 may be asymmetrical and is less tilted from a vertical direction on the side abutting the dummy control gate 138' than the opposite side abutting the control gate spacer 140 and/or the floating gate spacer 142.

With reference to FIG. 25, a flowchart 2500 of some embodiments of a method for forming an IC comprising an embedded memory boundary structure with a floating gate test structure is provided. The IC may, for example, correspond to the IC of FIGS. 5-24.

At 2502, a substrate is provided. The substrate comprises a memory region and a logic region. In some embodiments, the substrate is recessed within the memory region A memory dielectric layer is formed in memory region. See, for example, FIG. 5.

At 2504, a memory dielectric layer is formed within the memory region. See, for example, FIG. 6.

At 2506, a multilayer memory film is formed within the memory region covering the substrate. See, for example, FIGS. 7-9.

At 2508, memory cell structures and memory test structures are formed within the memory region from the multilayer memory film. See, for example, FIGS. 10-15.

At 2510, a logic device is formed and patterned within the logic region. In some embodiments, the logic device is formed by depositing a stack of precursor layers including one or more logic dielectric layers, one or more logic gate layers, and a logic gate masking layer followed by a patterning process. The memory region may be covered and protected by a protection layer and a memory hard mask during the formation of the logic device. Then, a sidewall spacer and source/drain regions are formed within the logic region and the memory region. See, for example, FIGS. 16-17.

At 2512, in some embodiments, a resist protective oxide (RPO) liner is formed to cover the memory test region. Then, source/drain regions are formed alongside the memory cell structure and logic device and may be absent from the memory test region. A silicidation process may be then performed to form silicide pads on the source/drain regions. See, for example, FIG. 18.

At 2514, the memory test structure is etched back during the etching back process of the logic device to expose the dummy control gates. See, for example, FIGS. 19-20.

At 2516, a lower inter-layer dielectric layer is formed to fill spaces between the memory device structures in memory region and the logic devices within the logic region. An aspect ratio between memory devices is lowered for the inter-layer dielectric layer's filling in because of the absence of the sidewall spacer in memory region. See, for example, FIG. 21.

At 2518, a replacement gate process is performed to replace the logic gate electrodes by metal gate electrodes for the logic devices within the logic region. See, for example, FIGS. 22-23.

At 2520, an upper inter-layer dielectric layer is formed on the lower inter-layer dielectric layer overlying the memory device structures in memory region and the logic devices within the logic region. Contact vias and floating gate test contact vias are subsequently formed through the upper inter-layer dielectric layer and respectively land on the source/drain regions and the dummy floating gates. The floating gate test contract vias may be formed through the dummy control gates and/or the spacers alongside the dummy control gates. See, for example, FIG. 24.

While the flowchart 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards an integrated circuit (IC). The IC comprises a memory cell structure including a pair of control gates respectively separated from a substrate by a pair of floating gates and a pair of select gate electrodes disposed on opposite sides of the pair of control gates. A memory test structure includes a pair of dummy control gates respectively separated from the substrate by a pair of dummy floating gates and a pair of dummy select gate electrodes disposed on opposite sides of the pair of dummy control gates. The memory test structure further includes a pair of conductive floating gate test contact vias respectively extending through the pair of dummy control gates and reaching on the dummy floating gates.

Further, some embodiments of the present application are directed towards a memory test structure of an embedded memory device. The memory test structure comprises a dummy floating gate disposed over a substrate and a dummy control gate overlying the dummy floating gate and separated from the dummy floating gate by a dummy control gate dielectric. The memory test structure further comprises a conductive floating gate test contact via directly contacting the dummy control gate and the dummy floating gate.

Further, some embodiments of the present application are directed towards an integrated circuit (IC). The IC comprises a plurality of memory cell structures disposed in a memory region and a plurality of memory test structures disposed at a periphery of the memory cell structures over a substrate. A memory test structure of the plurality of memory test structures comprises a dummy control gate separated from the substrate by a dummy floating gate and a conductive floating gate test contact via directly contacting the dummy control gate and the dummy floating gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an integrated circuit (IC), the method comprising:
   forming a multilayer film to form a plurality of memory cell structures over a substrate and a plurality of memory test structures next to the memory cell structures, wherein a memory test structure of the plurality of memory test structures comprises a dummy control gate separated from the substrate by a dummy floating gate; and
   forming a conductive floating gate test contact via along sidewalls of the dummy control gate and the dummy floating gate.

2. The method according to claim 1, further comprising:
   forming a control gate spacer along sidewalls of the dummy control gate; and
   forming a floating gate spacer alongside the control gate spacer and the dummy floating gate, wherein the conductive floating gate test contact via abuts the control gate spacer and the floating gate spacer.

3. The method according to claim 2, wherein forming the control gate spacer and the floating gate spacer comprising forming one or more layers of dielectric materials such as silicon dioxide, silicon nitride, or a combination thereof.

4. The method according to claim 1, further comprising:
   forming a dummy capping layer overlying the memory cell structures and the memory test structures;
   forming a plurality of logic devices on a logic region, a logic device of the plurality of logic devices including a logic gate electrode separated from the substrate by a logic gate dielectric and a logic hard mask overlying the logic gate electrode;
   removing the dummy capping layer from the memory test structures; and
   performing an etching back process to the logic device and the memory test structures.

5. The method according to claim 4, wherein forming the logic device comprises:
   forming a logic gate dielectric layer over the dummy capping layer on a memory region and directly on the substrate on the logic region;
   forming a polysilicon layer on the logic gate dielectric layer; and
   performing an etch into the logic gate dielectric layer and the polysilicon layer to form the logic gate electrode and the logic gate dielectric stacked on the logic region.

6. The method according to claim 4, wherein forming the plurality of memory cell structures comprises:
   forming a pair of floating gates respectively on first and second channel regions of the substrate;
   forming a pair of control gates respectively on the floating gates; and
   forming a pair of select gate electrodes respectively on the first and second channel regions, and laterally alongside the control gates.

7. The method according to claim 6, wherein dummy select gate electrodes and the select gate electrodes are formed by a conformal deposition process followed by a vertical etch process to leave vertical portions respectively alongside the floating gates and the dummy floating gates.

8. The method according to claim 7, further comprises:
   forming a contact etch stop layer (CESL) along an outline of the plurality of memory cell structures, the memory test structures, and the logic device;
   forming a lower inter-layer dielectric layer on the CESL between the plurality of memory cell structures, the memory test structures, and the logic device; and
   forming an upper inter-layer dielectric layer over the lower inter-layer dielectric layer.

9. The method according to claim 8, wherein the conductive floating gate test contact via is formed through the upper inter-layer dielectric layer.

10. A method for forming an integrated circuit (IC), the method comprising:
    depositing a floating gate layer over a substrate comprising a memory region and a logic region;
    forming and patterning a multilayer memory film over the floating gate layer;
    performing a first etch of the multilayer memory film and a second etch of the floating gate layer to form a control gate, a floating gate, a dummy control gate, and a dummy floating gate in the memory region, wherein a memory cell structure comprises the control gate and the floating gate, and wherein a memory test structure comprises the dummy control gate and the dummy floating gate;

depositing and etching a floating gate spacer layer to form a floating gate spacer abutting a sidewall of the floating gate in the memory cell structure and a dummy floating gate spacer abutting a sidewall of the dummy floating gate in the memory test structure; and forming a conductive floating gate test contact via within a conductive floating gate test contact via opening formed by a series of etching and patterning processes to expose the dummy floating gate spacer and the dummy floating gate.

11. The method according to claim 10, further comprising performing a thermal oxidation process to an upper surface of the substrate to form a precursor dielectric layer in the memory region, wherein forming the precursor dielectric layer reduces a height of the upper surface of the substrate.

12. The method according to claim 10, further comprising:

forming a memory dielectric layer over the substrate in the memory region through a deposition process;

depositing a dielectric material over the substrate in the memory region and logic region to form a conformal layer comprising a memory pad layer in the memory region and a lower pad layer in the logic region;

etching and patterning the dielectric material in the memory region to align a top surface of the dielectric material in the memory region with a top surface of the dielectric material in the logic region;

forming an upper pad layer in the logic region through a deposition process;

forming isolation structures through the memory pad layer and the upper pad layer, wherein the isolation structures comprise trenches; and performing a planarization process on the upper pad layer to fill the trenches.

13. The method according to claim 10, wherein the series of etching and patterning processes comprises:

performing a linear remove step with strong etching selectivity of dielectric material to polysilicon material; and performing etching steps with an etchant more selective to materials of floating gate spacers to form an opening for the conductive floating gate test contact via, wherein the opening is asymmetrical and tilted.

14. The method according to claim 10, further comprising performing an etching back process to remove upper layers of the memory cell structure and the memory test structure including a control gate hard mask layer and an upper portion of floating gate spacers to reach the control gate and the dummy control gate.

15. The method according to claim 14, wherein the etching back process is a dry etch process that includes plasma from fluorocarbon and He etchants.

16. A method for forming an integrated circuit (IC), the method comprising:

forming a plurality of memory cell structures and a plurality of memory test structures over a substrate, wherein a memory test structure of the plurality of memory test structures comprises a pair of dummy control gates respectively separated from the substrate by a pair of dummy floating gates and a pair of dummy select gate electrodes disposed on opposite sides of the pair of dummy control gates;

forming a pair of elongated trenches that extends through the plurality of memory test structures; and forming a pair of conductive floating gate test contact vias in the pair of elongated trenches, wherein the pair of conductive floating gate test contact vias is formed contacting sidewalls of the pair of dummy control gates and reaches on the pair of dummy floating gates.

17. The method according to claim 16, further comprising:

forming a dummy capping layer overlying the memory cell structures and the memory test structures;

forming a plurality of logic devices on a logic region, a logic device of the plurality of logic devices including a logic gate electrode separated from the substrate by a logic gate dielectric and a logic hard mask overlying the logic gate electrode;

removing the dummy capping layer from the memory test structures; and performing an etching back process to the logic device and the memory test structures.

18. The method according to claim 17, wherein the etching back process removes the logic hard mask to expose the logic gate electrode and removes a dummy control gate hard mask to expose dummy control gates.

19. The method according to claim 17, wherein forming the logic device comprises:

forming a logic gate dielectric layer over the dummy capping layer and directly on the substrate on the logic region;

forming a polysilicon layer on the logic gate dielectric layer; and performing an etch into the logic gate dielectric layer and the polysilicon layer to form the logic gate electrode and the logic gate dielectric stacked on the logic region.

20. The method according to claim 17, wherein a resist protective oxide (RPO) liner is formed to cover and prevent silicidation of the memory test structures prior to the etching back.

* * * * *